United States Patent
Ito et al.

(10) Patent No.: US 8,168,893 B2
(45) Date of Patent: May 1, 2012

(54) MULTILAYER WIRING BOARD WITH CONCAVE PORTION FOR ACCOMODATING ELECTRONIC COMPONENT

(75) Inventors: Sotaro Ito, Gifu (JP); Michimasa Takahashi, Gifu (JP); Yukinobu Mikado, Gifu (JP)

(73) Assignee: Ibiden, Co., Ltd., Ogaki-shi (JP)

( * ) Notice: Subject to any disclaimer, the term of this patent is extended or adjusted under 35 U.S.C. 154(b) by 816 days.

(21) Appl. No.: 12/197,554

(22) Filed: Aug. 25, 2008

(65) Prior Publication Data
US 2009/0188703 A1 Jul. 30, 2009

Related U.S. Application Data

(60) Provisional application No. 61/023,523, filed on Jan. 25, 2008.

(51) Int. Cl.
*H05K 1/16* (2006.01)
*H05K 1/18* (2006.01)

(52) U.S. Cl. ......... 174/260; 361/761; 361/818

(58) Field of Classification Search ......... 361/761–764, 361/818; 174/260; 29/832
See application file for complete search history.

(56) References Cited

U.S. PATENT DOCUMENTS

| | | | |
|---|---|---|---|
| 5,432,677 A * | 7/1995 | Mowatt et al. | 361/719 |
| 6,204,454 B1 * | 3/2001 | Gotoh et al. | 174/255 |
| 7,049,528 B2 * | 5/2006 | Kariya et al. | 174/262 |
| 7,751,202 B2 * | 7/2010 | Seo et al. | 361/795 |
| 2005/0017740 A1 | 1/2005 | Higashitani et al. | |
| 2007/0095471 A1 | 5/2007 | Ito et al. | |
| 2007/0182000 A1 | 8/2007 | Higashitani et al. | |
| 2008/0007927 A1 | 1/2008 | Ito et al. | |
| 2008/0117608 A1 * | 5/2008 | Seo et al. | 361/761 |
| 2010/0159647 A1 | 6/2010 | Ito et al. | |

FOREIGN PATENT DOCUMENTS

| | | |
|---|---|---|
| JP | 2001-274034 | 10/2001 |
| JP | 2001-339165 | 12/2001 |
| JP | 2002-16327 | 1/2002 |
| JP | 2002-050874 | 2/2002 |
| JP | 2006-019342 | 1/2006 |
| WO | 2007/069789 | 6/2007 |

* cited by examiner

*Primary Examiner* — Zachary M Pape
(74) *Attorney, Agent, or Firm* — Oblon, Spivak, McClelland, Maier & Neustadt, L.L.P.

(57) ABSTRACT

A multilayer wiring board includes a multilayer wiring substrate having a concave portion which accommodates an electronic component. The multilayer wiring substrate has multiple insulation layers, multiple conductive circuits, multiple vias and an electromagnetic shielding layer. The conductive circuits are separated by the insulation layers and electrically connected through the vias. The electromagnetic shielding layer has a roughened surface and formed along one of a bottom surface and side surfaces of the concave portion in the multilayer wiring substrate.

9 Claims, 18 Drawing Sheets

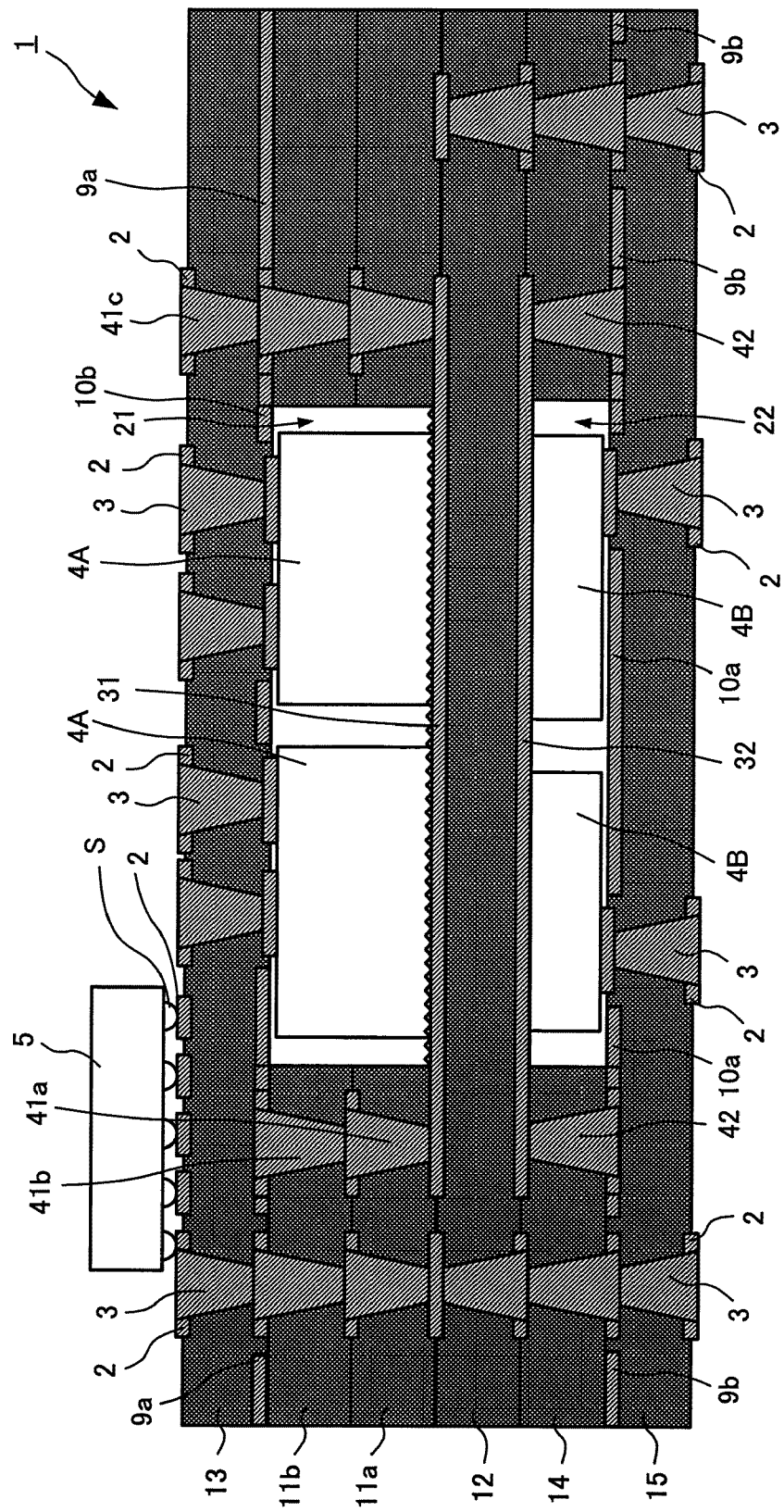

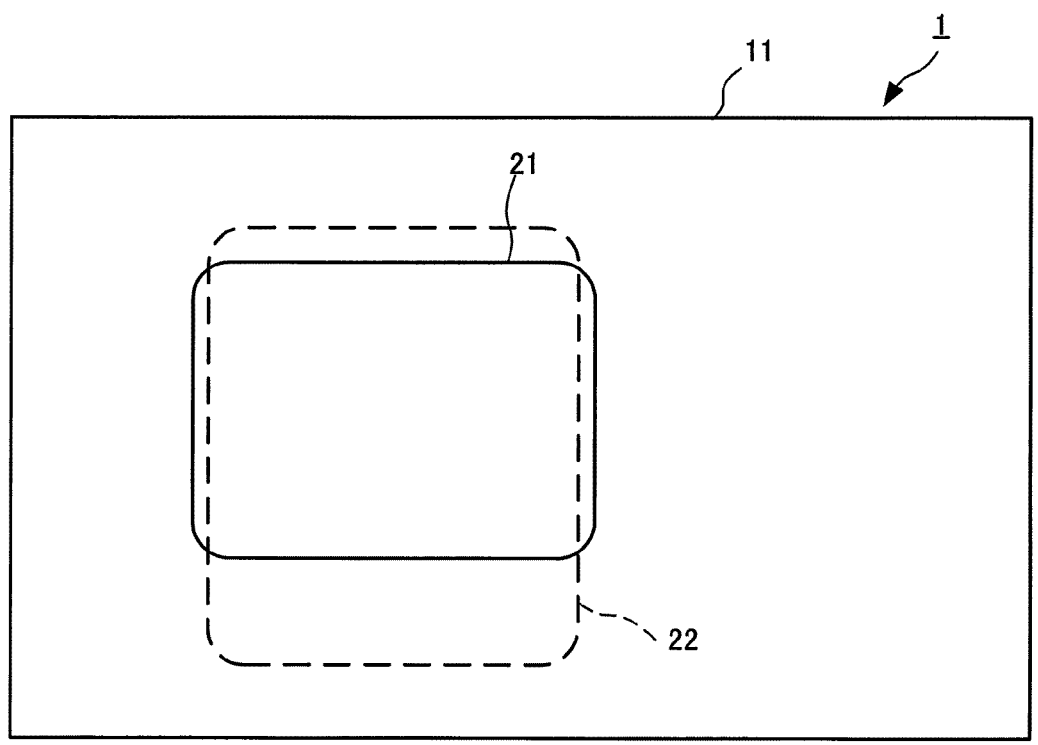

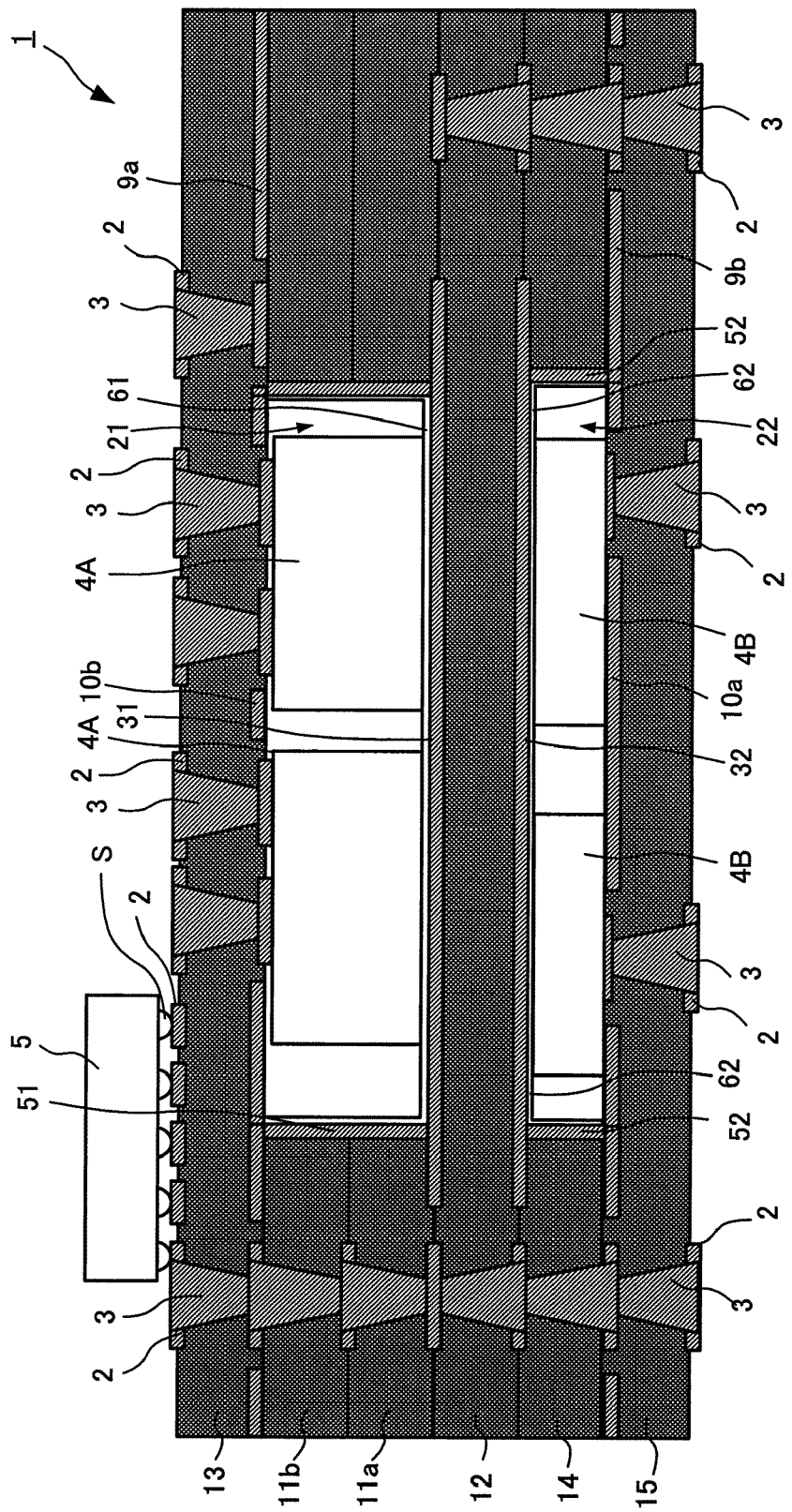

FIG. 16

| Sample | Ra ($\mu$m) | RMS ($\mu$m) | Surface length ($\mu$m) |
|---|---|---|---|
| effect 1 | 0.12 | 0.16 | 92 |
| effect 2 | 0.22 | 0.32 | 29 |
| compare | 0.24 | 0.27 | 24 |

MULTILAYER WIRING BOARD WITH CONCAVE PORTION FOR ACCOMODATING ELECTRONIC COMPONENT

CROSS-REFERENCE TO RELATED APPLICATIONS

The present application claims the benefits of priority to U.S. Provisional Application No. 61/023,523, filed Jan. 25, 2008. The contents of that application are incorporated herein by reference in their entirety.

BACKGROUND OF THE INVENTION

1. Field of the Invention

The present invention relates to a multilayer wiring board and its manufacturing method; more specifically, a multilayer wiring board with built-in electronic components such as an IC and its manufacturing method.

2. Discussion of the Background

Portable information devices (so-called mobile data terminals) are becoming more compact and highly functional. As for a multilayer printed wiring board with built-in semiconductor elements, for example, Japanese Laid-Open Patent Publication 2001-339165 and Japanese Laid-Open Patent Publication 2002-050874 describe multilayer printed wiring boards structured with a semiconductor element, insulation layers formed on a substrate so as to cover the semiconductor element, conductive circuits formed on the surfaces of the insulation layers, and via holes formed in the insulation layers to electrically connect the conductive circuits and the pads on the semiconductor element.

In such multilayer printed wiring boards, external connection terminals (such as a PGA or BGA) are formed on the outermost surface and the built-in semiconductor element in the substrate is electrically connected to the outside through those external connection terminals.

Also, Japanese Laid-Open Patent Publication 2001-274034 describes electronic-component packaging technology and high-density mounting of electronic components along with a shielding effect on electronic components from electromagnetic noise. Japanese Laid-Open Patent Publication 2001-274034 describes an electronic-component package which has: a concave portion formed in the core material; a semiconductor chip embedded in the concave portion; an insulation layer formed on the surface of the core material that is on the opening side of the concave portion to cover the concave portion; a wiring layer formed on the surface of the insulation layer; and vias formed in the insulation layer and electrically connecting the wiring layer and electrode terminals formed on the surface of the semiconductor chip that is on the opening side of the concave portion. In such an electronic-component package, the inner walls and the bottom of the concave portion are structured with conductive metal.

Furthermore, Japanese Laid-Open Patent Publication 2006-019342 describes that harmonic radiation noise may be isolated and reflection of such noise may be substantially reduced. Noise suppression may be achieved by structuring a metal shield which covers a semiconductor IC embedded in a multilayer substrate and covers a surface of the multilayer substrate, and having a magnetic sheet disposed between the surface of the multilayer substrate and the metal shield.

The contents of those publications are incorporated herein by reference in their entirety.

SUMMARY OF THE INVENTION

According to one aspect of the present invention, a multilayer wiring board includes a multilayer wiring substrate having a concave portion which accommodates an electronic component. The multilayer wiring substrate has multiple insulation layers, multiple conductive circuits, multiple vias and an electromagnetic shielding layer. The conductive circuits are separated by the insulation layers and electrically connected through the vias. The electromagnetic shielding layer has a roughened surface and formed along one of a bottom surface and side surfaces of the concave portion in the multilayer wiring substrate.

According to another aspect of the present invention, a multilayer wiring board includes a multilayer wiring substrate having a concave portion which accommodates an electronic component. The multilayer wiring substrate has multiple insulation layers, multiple conductive circuits, multiple vias and an electromagnetic shielding layer. The conductive circuits are separated by the insulation layers and electrically connected through the vias. The electromagnetic shielding layer includes multiple electromagnetic shielding sub-layers and formed along one of a bottom surface and side surfaces of the concave portion in the multilayer wiring substrate.

According to yet another aspect of the present invention, a method of manufacturing a multilayer printed wiring board includes forming a concave portion in one of insulation layers in a multilayer wiring substrate, forming an electromagnetic shielding layer along one of a bottom surface and side surfaces of the concave portion, roughening a surface of the electromagnetic shielding layer, and placing an electronic component in the concave portion.

According to still another aspect of the present invention, a method of manufacturing a multilayer printed wiring board includes forming a concave portion in one of insulation layers in the multilayer wiring substrate, forming a first electromagnetic shielding sub-layer along one of a bottom surface and side surfaces of the concave portion, forming a second electromagnetic shielding sub-layer over the first electromagnetic shielding sub-layer with a material having at least one of a reflection loss of electromagnetic waves and an absorption loss of electromagnetic waves, and placing an electronic component in the concave portion. The reflection loss of electromagnetic waves of the second electromagnetic shielding sub-layer is less than a reflection loss of electromagnetic waves of the first electromagnetic shielding sub-layer. The absorption loss of electromagnetic waves of the second electromagnetic shielding sub-layer is greater than an absorption loss of electromagnetic waves of the first electromagnetic shielding sub-layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a cross-sectional view of a multilayer printed wiring board in which electromagnetic shielding layers around concave portions are structured with vias according to an embodiment of the present invention;

FIG. 3 is a plan view showing an example of the positional relationship of the concave portions of a multilayer wiring board according to an embodiment of the present invention;

FIG. 5 is a cross-sectional view of a multilayer printed wiring board in which electromagnetic shielding layers on the peripheries of the concave portions are structured with conductive layers according to an embodiment of the present invention;

FIGS. 10 and 11 are images showing the surfaces on which a roughening treatment is performed (Examples 1 and 2) and FIG. 12 is an image showing the surface without a treatment (Comparative Example);

FIGS. 13 and 14 are images showing the cross-sections on which a roughening treatment is performed (Examples 1 and 2) and FIG. 15 is an image showing the surface without a treatment (Comparative Example); and FIG. 16 is a table showing the calculation results of the parameters of surface roughness of a copper-clad laminate.

DETAILED DESCRIPTION OF THE PREFERRED EMBODIMENTS

Figure 2A:
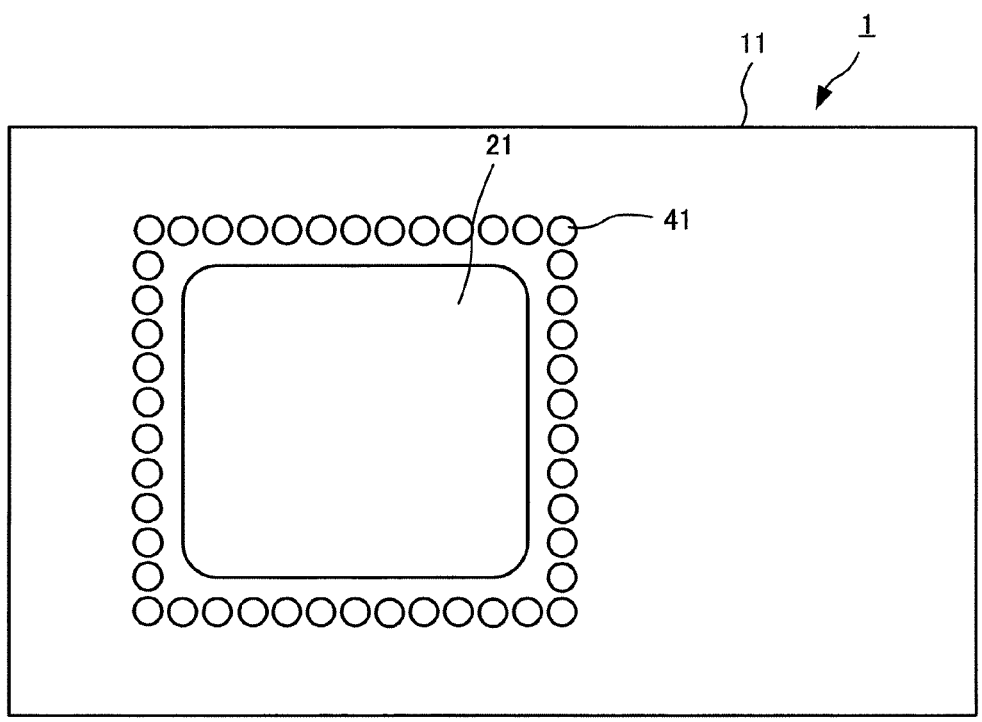
FIGS. 2A and 2B each illustrate an array of vias formed on the periphery of a concave portion of a multilayer wiring board according to an embodiment of the present invention.

The embodiments will now be described with reference to the accompanying drawings, wherein like reference numerals designate corresponding or identical elements throughout the various drawings.

Embodiment 1

FIG. 1 is a cross-sectional view of a multilayer wiring board according to Embodiment 1 of the present invention. In Embodiment 1, electromagnetic shielding layers around the concave portions are structured with an array of vias filled with metal.

Multilayer wiring board 1 is structured with multiple insulation layers (11a, 11b, 12, 13, 14, 15), conductive circuits 2 separated by insulation layers (11a, 11b, 12, 13, 14, 15) and vias 3 electrically connecting conductive circuits 2. In multilayer wiring board 1 according to Embodiment 1 of the present invention, concave portions 21, 22 are formed in sections of insulation layers (11a, 11b, 14). On the bottom surfaces of concave portions 21, 22, conductive layers 31, 32 are formed respectively. In addition, around concave portions 21, 22, vias filled with metal (also referred to as "filled vias") (41a, 41b) are formed.

The surface of conductive layer 31 formed on the bottom of concave portion 21 is roughened. Although the surface of conductive layer 32 formed on the bottom of concave portion 22 is not roughened, it may be roughened.

Conductive layer (9a) is formed on the surface of the insulation layer having concave portion 21; conductive layer (9b) is formed on the surface of the insulation layer having concave portion 22. Also, conductive layer (10a) is positioned opposite so as to sandwich any insulation layer on the bottom side of concave portion 21; conductive layer (10b) is positioned opposite so as to sandwich any insulation layer on the bottom side of concave portion 22.

Filled vias (41a, 41b, 42) formed around concave portions 21, 22 are connected to conductive layers 31, 32 formed on the bottoms of concave portions 21, 22. Conductive layers 31, 32 formed on the bottoms of concave portions 21, 22 and filled vias (41a, 41b, 42) formed around concave portions 21, 22 are electrically continuous and thus have the same electrical potential. They may be connected to, for example, ground (earth) to be kept at the base electrical potential of multilayer wiring board 1.

Filled vias (41a, 41b, 42) may not be connected to conductive layers 31, 32 formed on the bottoms of concave portions 21, 22. In such a case, filled vias (41a, 41b, 42) are preferred to be connected to a portion having the same base electrical potential as conductive layers 31, 32.

Conductive layers 9 on the surfaces of the insulation layers are connected to filled vias (41a, 41b, 42) and may be kept at the base electrical potential of multilayer wiring board 1.

In concave portions 21, 22, electronic components (4A, 4B) are embedded respectively. Electronic components (4A, 4B) embedded in concave portions 21, 22 are connected to conductive circuits 2 through vias 3 formed in insulation layers 13, 15 on concave portions 21, 22. In addition, electronic component 5 is also mounted on the surface layer of multilayer wiring board 1. Electronic component 5 is connected to conductive circuit 2 on the surface layer through solder bumps (S) formed on conductive circuit 2.

The depths of concave portions 21, 22 formed in insulation layers (11a, 11b, 14) are set according to the configurations of the electronic components to be embedded. For example, as shown in upper concave portion 21 in FIG. 1, concave portion 21 may be formed extending through two or more layers of insulation layers (11a, 11b). In such a case, filled vias (41a, 41b) for electromagnetic shielding are formed to extend at least the entire height of concave portion 21.

Figure 2B:
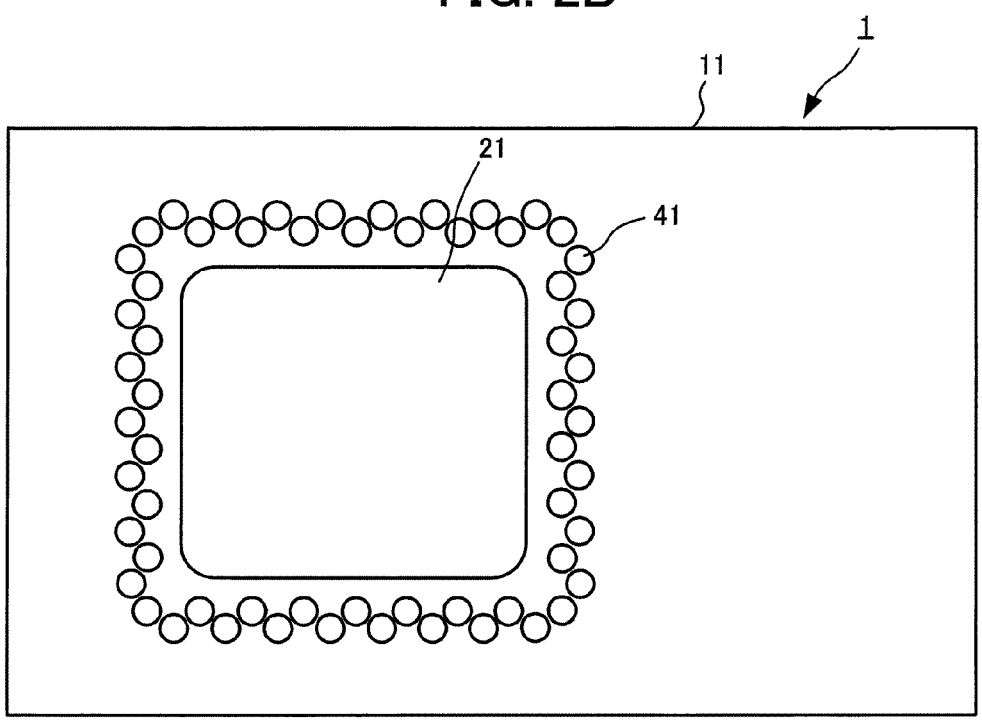

FIGS. 2A and 2B are views illustrating an array of vias 41 formed around concave portion 21 in multilayer wiring board 1. In FIG. 2A, around rectangular-shaped concave portion 21, vias 41 are arranged in a straight line along each side. In FIG. 2B, around rectangular-shaped concave portion 21, vias 41 are arranged zigzag in a direction along each side. The opening configuration of concave portion 21 formed in insulation layer 11 is not limited to be rectangular, but is formed according to the configuration of electronic component 4 to be embedded and the disposition of circuits. An array of filled vias 41, which are formed along the periphery of the concave opening around concave portion 21, may be set in a line along the periphery of the concave opening as shown in FIG. 2A, or may be set zigzag as shown in FIG. 2B.

Intervals (spaces) among vias 41 may be set so as to block electromagnetic waves generated from the electronic component embedded in concave portion 21 or to block electromagnetic waves with certain frequencies that may have an impact on the electronic component. The smaller the spaces among filled vias 41, the higher the frequencies to be blocked. Filled vias (41a, 41b, 42) are in a column shape and are preferred to be connected to the adjacent filled vias. In such a case, filled vias (41a, 41b, 42) form a sheet of conductive layer without spaces and thus the electromagnetic shielding effects are high.

Conductive layers 31, 32 and filled vias (41a, 41b, 42) entirely surround the outer surfaces except for the top surfaces where connection pads for electronic components (4A, 4B) built in concave portions 21, 22 are arranged. Accordingly, electromagnetic shielding effects in directions parallel to each side surface as well as the bottom surface of electronic components (4A, 4B) may be achieved at the same time. Since two concave portions 21, 22 in FIG. 1 are separated from each other by conductive layers 31, 32 and the peripheries of concave portions 21, 22 are surrounded by filled vias (41a, 41b, 42), electronic component (4A) in the upper concave portion 21 in FIG. 1 and electronic component (4B) in the lower concave portion 22 are electromagnetically shielded from each other.

FIG. 3 is a plan view illustrating an example of the positional relationship of concave portions 21, 22 in multilayer wiring board 1 shown in FIG. 1. As shown in FIG. 3, even if two concave portions 21, 22 do not entirely overlap, since the peripheries of concave portions 21, 22 are surrounded by filled vias 41, 42, concave portions 21, 22 are electromagnetically shielded from each other. Also, electronic component 5 mounted on the surface layer of multilayer printed wiring board 1 and electronic component (4B) embedded at least in one concave portion 22 are electromagnetically shielded from each other.

Electronic components (4A, 4B) embedded in concave portions 21, 22 and electronic component 5 mounted on the surface layer of multilayer printed wiring board 1 include, for example, digital signal IC, analog signal IC or memory IC. Components other than those may include passive components such as resistor, capacitor or inductor, or a switching element. Circuits structured on concave portions 21, 22 or on the surface layer are digital signal circuits, analog signal circuits, or memory circuits or the like. Since concave portions 21, 22 are each separated by electromagnetic shields, electromagnetic interference between each other is suppressed. Thus, within one unit of multilayer printed wiring board 1, digital signal circuits, analog signal circuits and memory circuits may be mixed.

As for a metal to be used for conductive layers 31, 32 as electromagnetic shields, any one of nickel, copper or chrome, or a metal containing two or more of those, is preferred. As examples of such a metal, copper, copper-chrome alloy, copper-nickel alloy, nickel, nickel-chrome alloy and chrome are listed. However, metals other than those may be used.

The thickness of conductive layers 31, 32 that are formed using the above metal is preferred to be in the range of 5-20 µm. That is because if the thickness is less than 5 µm, the effect as a shielding layer may be offset. On the other hand, if the thickness exceeds 20 µm, the effect as a shielding layer may not be enhanced.

As a method of forming conductive layers 31, 32, electroless plating, electrolytic plating, sputtering, or vacuum deposition is preferred. That is because it is easy to form a metal film having a uniform film thickness, and thus an electromagnetic shielding effect may be achieved more easily. Conductive layers 31, 32 formed using such a method may be made single layer or multilayer with two or more layers (also referred to as "sub-layers"). When forming multiple layers, they may be formed using the same method or may be formed using different methods. Depending on the type of metal layer and its thickness to form an electromagnetic shielding layer, its formation may be properly carried out. By doing so, the electromagnetic shielding effect will not dramatically drop.

By using the conductive layer formed on the surface of insulation layer 11, conductive layer 31 is positioned on the bottom of concave portion 21 to accommodate electronic component (4A); on conductive layer 31, it is preferred that electronic component (4A) (such as a semiconductor element) be built in. That is because a uniform depth in concave portion 21 may be achieved, and electronic component (4A) built in or accommodated in concave portion 21 may be prevented from leaning. Accordingly, even if the substrate that accommodates electronic component (4A) is made of resin, via-hole configurations may be formed as required when forming vias 3 in resin insulation layer 13 to connect to the connection pads of electronic component (4A). In addition, since conductive layer 31 is formed in the resin insulation layer, warping caused by thermo stress or external stress may decrease. As a result, electrical connectivity or connection reliability between the connection pads of electronic component (4A) and conductive circuit 2 including vias 3 which is connected to the connection pads may be easily ensured.

Also, conductive layers 31, 32 on the bottom of the concave portions may have flat surfaces. By such, the ability to retain the concave configuration or adhesiveness with a bonding agent may be easily ensured. According to requirements, roughened surfaces may be formed in conductive layers 31, 32. Through roughened surfaces, conductive layers 31, 32 and bonding agent are adhered and thus adhesive strength may be easily secured.

In describing this further in detail, insulation layers 11, 14, in which concave portions 21, 22 to accommodate electronic components (4A, 4B) will be formed, are made of resin material such as glass fabric or the like impregnated mainly with a reinforcing agent such as glass epoxy resin or the like. Therefore, if concave portions 21, 22 are formed by a spot facing process or the like, at the bottom of concave portions 21, 22 irregular roughness is formed depending on location. As a result, the depth of concave portions 21, 22 tends to be irregular. Especially when cross sections of concave portions 21, 22 are made substantially rectangular, around the four corners, the depth of concave portions 21, 22 tends to be shallow compared with other areas. Therefore, by forming conductive layers 31, 32 on the bottom of concave portions 21, 22 as in an embodiment of the present invention, it is easier to make a uniform depth in concave portions 21, 22. Especially, when cross-sections of concave portions 21, 22 are made rectangular, the depth of concave portions 21, 22 around the four corners may easily be made uniform.

Accordingly, when accommodating electronic components (4A, 4B) in concave portions 21, 22, electronic components (4A, 4B) may seldom tilt. Therefore, when forming vias 3 connected to the pads on built-in electronic components (4A, 4B) in insulation layers 13, 15, such via holes may be configured as desired. Furthermore, since conductive layers 31, 32 are formed tightly bonded between insulation layers 11, 12, 14, warping caused by thermo stress or external stress may seldom occur. As a result, for example, poor connection between the connection pads on electronic components (4A, 4B) and conductive circuits such as vias 3 may seldom occur, and thus electrical connectivity and connection reliability will not easily decrease.

Also, since it is easy to make uniform thickness in the adhesive-bonding layer formed between electronic components (4A, 4B) and conductive layers 31, 32, adhesiveness with a semiconductor element is made uniform. Thus, adhesiveness may be maintained easily for a long duration when reliability tests such as heat-cycle tests are conducted.

The area of conductive layers 31, 32 is made larger than the bottom of concave portions 21, 22 and may be formed by extending beyond the sides of concave portions 21, 22. Accordingly, conductive layers 31, 32 formed as such may show shielding effects in a direction parallel to the bottom surfaces of electronic components (4A, 4B) built in multilayer wiring board 1, and thus they are preferred to be formed along with electromagnetic shielding layers formed by arranging filled vias (41, 42).

Since filled vias (41a, 41b, 41c, 42) are connected to conductive layers 31, 32 which are in contact with electronic components, they show the effects of heat radiation. They may be formed all the way to the surface of the multilayer wiring board as filled vias (41c) are and may be connected to a heat radiation plate. Also, by forming filled vias on the back surfaces of conductive layers 31, 32 at the bottom of concave portions 21, 22, the routes to radiate heat may increase.

Conductive layers 31, 32 may be roughened at the bottom of the concave portions. As for a surface roughening method, a black oxide treatment, a chemical etching treatment, a matting treatment and a sandblasting method are listed. A black oxide treatment is a treatment in which a 5-7 μm roughness is formed by oxidation to roughen the surface. By conducting a surface roughening process on conductive layers 31, 32, electromagnetic waves radiated from electronic components (4A, 4B) embedded in the concave portions may be suppressed from making mirror reflections toward the openings of the concave portions. Accordingly, the impact from electromagnetic waves on electronic components may be reduced.

The surface roughening treatment may be conducted on the conductive layer positioned either on the bottom or the sides of the concave portion; however, it is preferred that the treatment be conducted on all the bottom and side surfaces of the concave portion.

In addition, when selecting the material to form conductive layers, by selecting material while taking into consideration reflection loss or absorption loss of electromagnetic waves, a higher electromagnetic shielding effect may be achieved.

Conductive layer 31 may be formed with material having greater absorption loss than wiring material to form conductive circuits. Conductive layer (10a) may be formed with material having reflection loss the same as, or greater than, wiring material to form conductive circuits. For example, when wiring is made of copper, conductive layer 31 may be made of iron and conductive layer (10a) may be made of silver, copper or aluminum. By forming the bottom and side surfaces of the concave portion with material having large absorption loss of electromagnetic waves, electromagnetic waves radiated from the electronic component embedded in the multilayer wiring board decrease. By forming the surface positioned opposite so as to sandwich any insulation layer at the bottom of the concave portion with material having large reflection loss, the impact from external electromagnetic waves is suppressed and the electromagnetic shielding effect is attained.

Conductive layers (32, 10b) may be formed in the same manner: conductive layer 32 may be formed with material having greater absorption loss than wiring material to form conductive circuits, and conductive layer (10b) may be formed with material having reflection loss the same as, or greater than, wiring material to form conductive circuits.

Also, if material is selected not for a combination of wiring material and a conductive layer, but for a combination of conductive layer and another conductive layer, a high electromagnetic shielding effect may be expected.

Conductive layer 31 formed on the bottom or side of concave portion 21 is made of material having less reflection loss of electromagnetic waves than conductive layer (10a) positioned opposite so as to sandwich any insulation layer at the bottom side of concave portion 21. Alternatively, conductive layer 31 is made of material having greater absorption loss of electromagnetic waves than conductive layer (10a). Likewise, regarding concave portion 22, material having less reflection loss of electromagnetic waves, or greater absorption loss of electromagnetic waves, than conductive layer (10b) is selected for conductive layer 32.

Furthermore, based on the position of conductive layer 31 formed on the bottom or a side of concave portion 21, the layer positioned opposite so as to sandwich any insulation layer on the bottom side of concave portion 21 may be conductive layer 32. Conductive layer 31 is made of material having less reflection loss of electromagnetic waves, or greater absorption loss of electromagnetic waves, than conductive layer 32. Conductive layer 32 is made in the same manner: conductive layer 32 may be made of material having less reflection loss of electromagnetic waves, or greater absorption loss of electromagnetic waves, than conductive layer 31.

For conductive layer 31 and conductive layer 32, when selecting material by considering the amount of reflection loss or absorption loss of electromagnetic waves, it is sufficient if the material is of such a combination to protect electronic components (4A, 4B) built in concave portions 21, 22 from interference by electromagnetic waves. Material selection as well as surface roughening treatment on conductive layers 31, 32 may enhance the electromagnetic shielding effect.

Conductive layers (9a, 9b) formed on the surfaces of the insulation layers having concave portions 21, 22, and conductive layers (10a, 10b) positioned opposite so as to sandwich any insulation layer on the bottom sides of concave portions 21, 22 are identified individually as conductive layers (9a, 9b, 10a, 10b) in relation to the positions of concave portions 21, 22. However, conductive layer (10a) and conductive layer (9b) may be formed on the same insulation layer, and may be connected to the same base electrical potential, and may be formed using the same material. Likewise, regarding conductive layer (10b) and conductive layer (9a), they may also be formed on the same insulation layer, and may be connected to the same base electrical potential, and may be formed using the same material.

Next, the steps are described in which multilayer wiring board 1 is manufactured when shielding the peripheries of concave portions 21, 22 with filled vias 41, 42. FIGS. 4A-4M are cross-sectional views partially showing the steps of manufacturing multilayer wiring board 1 according to Embodiment 1 of the present invention. When manufacturing multilayer wiring board 1 according to an embodiment of the present invention, a multilayer wiring substrate is used to structure it, such as one formed by laminating a copper-clad laminate made by adhering a copper foil on one surface or both surfaces of an insulative resin substrate.

Figure 4A:
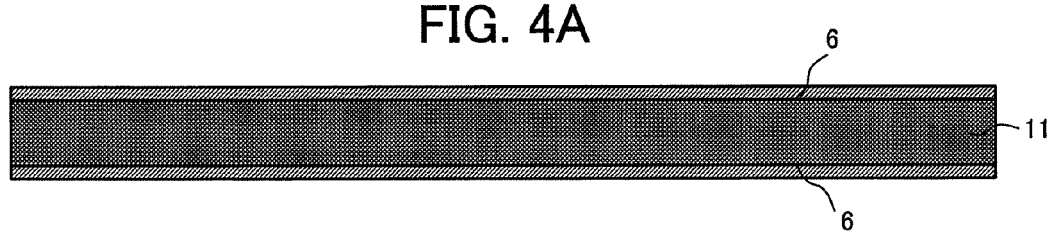
FIGS. 4A-4M are cross-sectional views partially showing the steps of manufacturing a multilayer wiring board according to an embodiment of the present invention.

FIG. 4A is a cross-sectional view of a double-sided copper-clad laminate. A double-sided copper-clad laminate is made of, for example, a laminate in which copper foil 6 is pasted on both surfaces of insulation layer 11. As for insulation layer 11, for example, glass epoxy may be used. Insulation layer 11 may also be made of insulative resin without fillers. By irradiating a laser on one surface of such a double-sided copper-clad laminate, via openings 7, 8 are formed that penetrate copper foil 6 on one side and insulation layer 11 to reach the back surface of copper foil 6 on the other side.

Figure 4B:
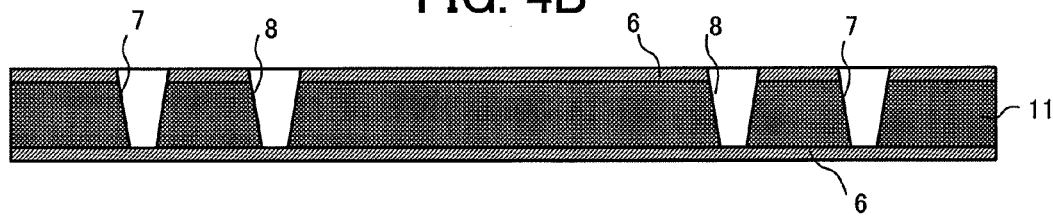

FIG. 4B is a cross-sectional view showing the double-sided copper-clad laminate in which via openings are formed. Via openings 7, 8 are made up of via openings 7 for connecting conductive circuits 2 and of via openings 8 for electromagnetic shielding. Here, via openings 8 for electromagnetic shielding are formed outside the region of concave portion 21 that accommodates later-described electronic component (4A), and are formed in such a manner that adjacent openings are coupled with each other.

The laser irradiation is conducted using pulse-generating carbon dioxide laser processing equipment, and the processing conditions are preferred to be set within the following range: pulse energy 0.5~100 mJ, pulse width 1~100 μs, pulse intervals 0.5 ms or longer, frequencies 2,000~3,000 Hz and number of shots 1~5.

The diameters of via openings 7, 8, which may be formed under such processing conditions, are preferred to be made in the range of 20-250 μm. The reasons are: if the opening diameter is smaller than 20 μm, forming vias tends to be technically difficult, and may lower electrical connectivity; on the other hand, if the diameter of via openings 7, 8 exceeds 250 μm, filling performance with plating may be poor, and may lower electrical connectivity or prevent high-density wiring.

For forming via openings 7, 8 in copper-clad laminate by laser irradiation, there are the following methods: a direct laser method in which openings are simultaneously made in copper foil 6 and insulation layer 11; and a conformal method in which the copper foil corresponding to via openings 7, 8 is removed in advance by etching, and then the laser is irradiated on insulation layer 11. Either method may be used.

To remove resin residue remaining inside via openings formed by laser irradiation, a desmear process is preferred to be used. The desmear process is conducted under a wet treatment such as a chemical process using an acid or oxidation agent (for example, chromic acid, permanganate) or under a dry treatment such as an oxygen plasma discharge process, a corona discharge process, an ultraviolet laser process or an excimer laser process. A desmear process may be selected among those according to an anticipated amount of residue based on the type and thickness of insulation layer 11, opening diameters and laser conditions.

Figure 4C:
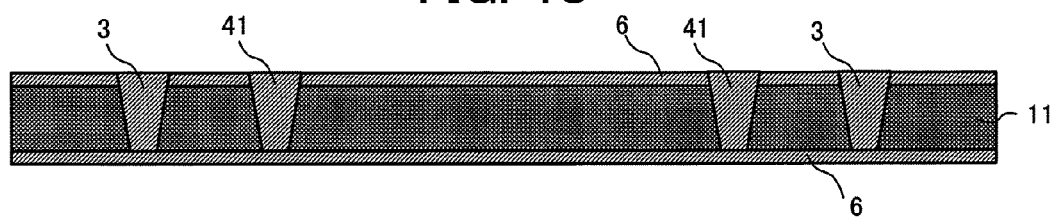

FIG. 4C is a cross-sectional view of the double-sided copper-clad laminate with via openings 7, 8 filled with metal. Electrolytic copper plating using copper foil 6 as a plating lead is performed in desmeared via openings 7, 8. Accordingly, electrolytic copper plating is completely filled in via openings and vias 3, 41 are formed. If necessary, after the process of electrolytic copper plating, the electrolytic copper plating bulging from the openings on the substrate may be removed by belt-sander polishing, buff polishing or etching to level the surface.

Figure 4D:
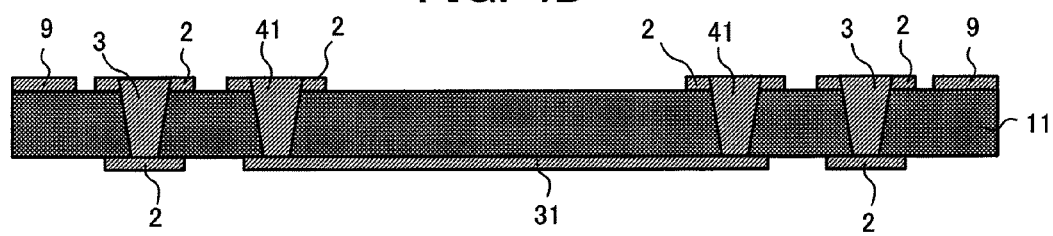

FIG. 4D is a cross-sectional view of the double-sided copper-clad laminate after conductive circuits 2 on both surfaces and conductive layer 31 have been formed. A resist layer is formed on copper foils 6 formed on both surfaces of insulation layer 11, which is then exposed to light and developed, and an etching treatment is conducted on the portion where the resist is not formed using an etching solution containing copper chloride (II) or the like. Then, by removing the resist, on one surface of insulation layer 11, conductive circuit 2 including via lands and an alignment mark for aligning positions and others are formed. On the other surface, conductive layer 31 having a size in relation to concave portion 21 for accommodating electronic component (4A), conductive circuit 2 including via lands, and an alignment mark for aligning positions and others are formed.

Multiple vias 41 for electromagnetic shielding are formed in such a way that they are coupled to each other, with one end exposed on one surface of insulation layer 11 and the other end connected to the surface of conductive layer 31 so as to form an electromagnetic shielding layer.

Furthermore, conductive layer 9 is formed on the surface of insulation layer 11. When covering the surface, it is preferred that the area to form concave portion 21 be excluded. Conductive layer 9 should not be coupled with conductive circuit 2 that is electrically connected to vias 3, but may be coupled with conductive circuit 2 that is connected to vias 41 for electromagnetic shielding.

As shown in FIG. 1, if the height of component (4A) is greater than the thickness of insulation layer 11, then insulation layer (11b) and copper foil 6 are further laminated on insulation layer 11 as shown in FIG. 4D, and vias 3 and conductive circuit 2 are formed.

Figure 4E:
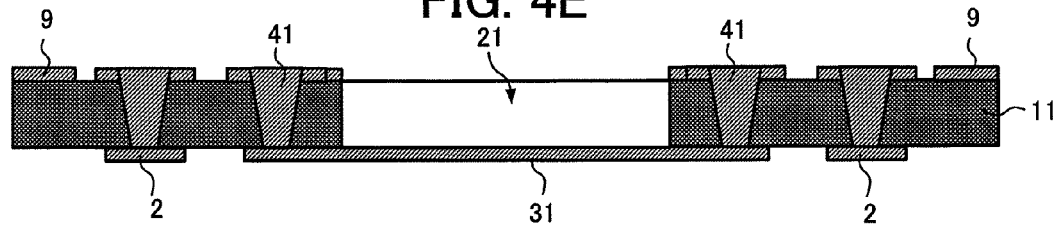

FIG. 4E is a cross-sectional view of a multilayer wiring substrate in which concave portion 21 for accommodating an electronic component is formed. On the surface region (concave-portion forming region) positioned opposite the surface where conductive layer 31 is formed on insulation layer 11, an opening is formed by, for example, laser processing that penetrates insulation layer 11 and reaches the surface of conductive layer 31. Concave portion 21 is formed so as to expose the surface of the conductive layer though the opening. Accordingly, a substrate for accommodating an electronic component is obtained. If required, after a resist-forming step and an etching treatment step, concave portion 21 may be formed in which conductive layer 31 is exposed.

For example, on a laminate having insulation layer 11 and insulation layer 12, by laser irradiation using pulse-generating carbon dioxide laser processing equipment, an opening that penetrates the insulation layer from the surface of insulation layer 11 through the resin layer and reaches the surface of the conductive layer is formed. Accordingly, a concave portion for an accommodated or built-in electronic component is obtained.

The conditions to process concave portion 21 for accommodating electronic component (4A) are preferred within the following range: pulse energy 0.5-100 mJ, pulse width 1-100 μs, pulse intervals 0.5 ms or longer, frequencies 2,000-3,000 Hz and number of shots 1-10.

By such laser processing as above, concave portion 21 for built-in electronic component (4A) is formed, and at the bottom of concave portion 21 conductive layer 31 (in this case, indicating copper foil 6) is exposed.

Figure 4F:
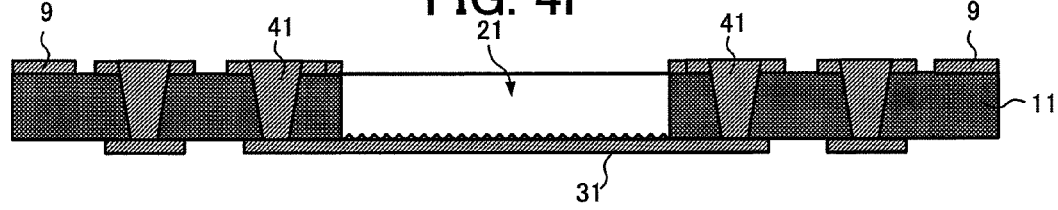

FIG. 4F is a view showing the roughened surface of conductive layer 31 exposed at the bottom of the concave portion. If the surface is roughened, reflection of electromagnetic waves occurs not in a certain direction but in scattered directions. Accordingly, the impact on the built-in component may be reduced. For the method of roughening the surface, a black oxide treatment, a chemical etching treatment, a matting treatment and a sandblasting method are listed.

For example, regarding an 800 μm-thick double-sided copper-clad laminate, in which a 35 μm-thick copper foil is laminated on both surfaces of glass-fabric epoxy resin substrate via an adhesive agent, a black oxide treatment is conducted by washing with water, removing grease using an alkaline solution and conducting soft etching, then by immersing in a black oxide treatment solution (solution containing trisodium phosphate and sodium chlorite) at 95° C. for two minutes. Accordingly, the copper surfaces are roughened. By doing so, the roughened surface shows a configuration resembling a cluster of trees with a roughness in the range of 0.1-1.0 μm. The length of the roughened surface is preferred to be more than three times longer than a copper surface which is not roughened.

Alternatively, a chemical etching treatment is conducted on the same double-sided copper-clad laminate by washing with water, removing grease using an acidic solution, soft etching and conducting a CZ treatment in an organic-acid micro etching solution (MECetchBOND CZ-8100 made by Mec Co., Ltd.) for one minute. Accordingly, the copper surfaces are roughened. By doing so, the roughened surfaces show a roughness in the range of 0.1-5.0 µm with acute angles. The RMS (Root Mean Square roughness) is preferred to be 0.30 µm or greater.

Figure 4G:
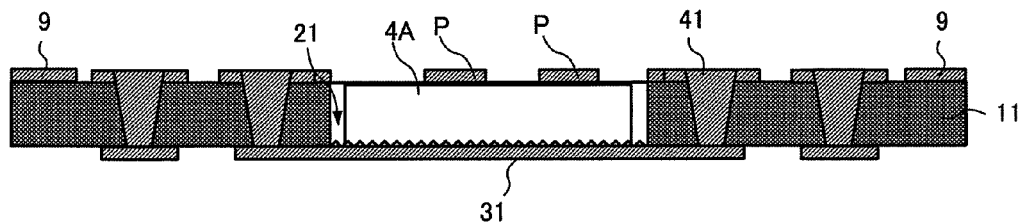

FIG. 4G is a cross-sectional view showing a multilayer wiring substrate with electronic component (4A) built in concave portion 21. In the substrate that accommodates an electronic component obtained through the steps to FIG. 4G, electronic component (4A) such as a semiconductor element is embedded. As for electronic component (4A) to be embedded, for example, a semiconductor element where an intermediate layer is formed to cover connection pads (P) may be used. The surface of the intermediate layer formed on electronic component (4A) excluding the portions covering connection pads (P) may be covered by conductive layer 10. Conductive layer 10 is formed so as not to be connected to connection pads (P) and conductive circuit 2.

The intermediate layer is provided so as to directly connect pads (P) of the semiconductor element and conductive circuit 2 including vias 3 of the multilayer wiring substrate. It is formed by disposing a thin-film layer on a die-pad and further adding a thick layer onto the thin-film layer; it is preferred to be structured with at least two or more layers of metal layer.

Also, the intermediate layer is preferred to be formed in a larger size than the die-pad of the semiconductor element. By doing so, it is easier to align with the die-pad and thus enhance electrical connectivity with the die-pad. Also, processing via openings by laser irradiation or photoetching may be conducted without damaging the die-pad. Accordingly, embedding the semiconductor element in the multilayer wiring substrate and making an electrical connection may be done precisely. Also, directly on the intermediate layer, a metal layer to become conductive circuit 2 of the multilayer wiring board may be formed.

In addition to the above-described manufacturing method, an intermediate layer may be formed on connection pads (P) of the semiconductor element through the following: a resist made of a dry film is formed on the entire surface of the connection-pad side of the semiconductor element, or on the metal film formed on the substrate for accommodating a semiconductor element in which a semiconductor element has been embedded; after the portion corresponding to an intermediate layer is removed, a thick layer is disposed by electrolytic plating; and the resist is removed by an etching solution.

Figure 4H:
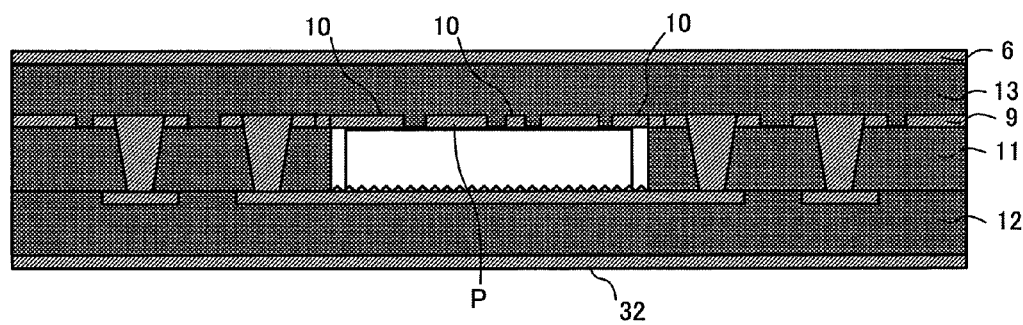

FIG. 4H is a cross-sectional view of the multilayer wiring substrate in which insulation layer 12 and copper foil 6 are laminated on insulation layer 11, and insulation layer 13 and copper foil 6 are formed on the layer where electronic component (4A) is accommodated. Insulation layer 12 is laminated on the surface of insulation layer 11 where conductive layer 31 is formed. Also, conductive layer 32, which will become the bottom surface of concave portion 22, is formed on the lower side. For example, a copper-clad substrate, formed by laminating copper foil 6 on a prepreg, which is an adhesive agent layer, is laminated by thermopressing on both surfaces of insulation layer 11 to form a laminated body. On the substrate with accommodated electronic component (4A), insulation layer 13 and copper foil 6 are laminated, and in the same manner, insulation layer 12 and copper foil 32 are laminated.

Figure 4I:
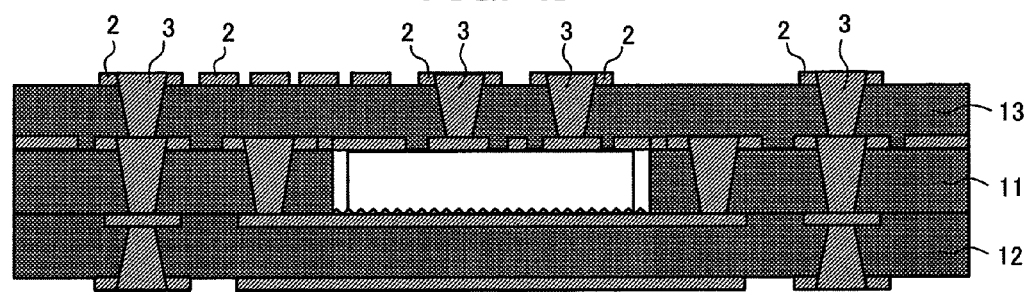

FIG. 4I is a cross-sectional view of a multilayer wiring substrate where vias 3 and conductive circuit 2 are formed in regard to insulation layers 12, 13, and conductive circuit 2 is formed on the surface layer. Regarding insulation layer 13, vias 3 and conductive circuit 2 are formed in the same manner as in insulation layer 11. At the same time, conductive layer 32, which will become the bottom surface of concave portion 22, is also formed at the lower portion. After laminating insulation layer 13 and copper foil 6, by conducting the same process described in the steps with reference to FIGS. 4B-4D, the following are formed: vias 3 which are electrically connected to the intermediate layer formed on connection pads (P) of the built-in semiconductor element; vias 3 which are electrically connected to conductive circuit 2 including vias 3 formed on insulation layer 11; and conductive circuit 2 formed on the outer side.

Figure 4J:
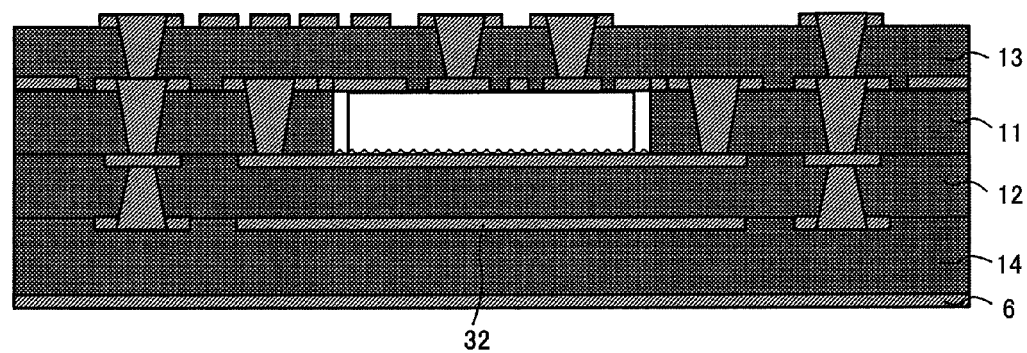

FIG. 4J is a cross-sectional view of the multilayer wiring substrate, with insulation layer 14 disposed on the lower portion to form concave portion 22 which will accommodate electronic component (4B). In the same manner as insulation layer 12 and copper foil 6 are laminated, insulation layer 14 and copper foil (6) are laminated.

Figure 4K:
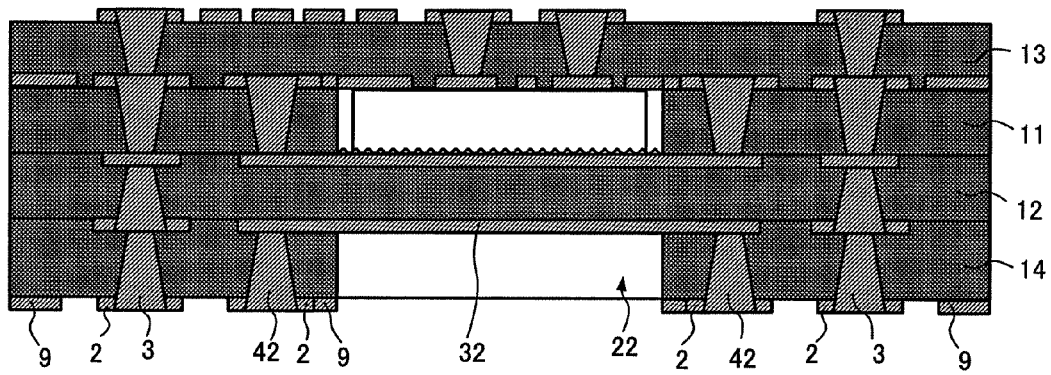

FIG. 4K is a cross-sectional view of the multilayer wiring substrate where vias 3, conductive circuit 2 and concave portion 22 are formed in regard to insulation layer 14 laminated in FIG. 4J. In the same manner as the steps with reference to FIGS. 4B-4E, vias 3 to be connected to conductive circuit 2, vias 42 arranged around concave portion 22 so as to be used as electromagnetic shielding, concave portion 22 and conductive layer 9 are formed. The bottom surface of concave portion 22 is conductive layer 32 formed through the step to form conductive circuit 2 with reference to FIG. 4I. The same as with conductive layer 31, the bottom surface of the concave portion may be roughened by conducting a treatment, such as a black oxide treatment, a chemical etching treatment, a matting treatment or a sandblasting method, on conductive layer 32 exposed through the laser process.

Figure 4L:
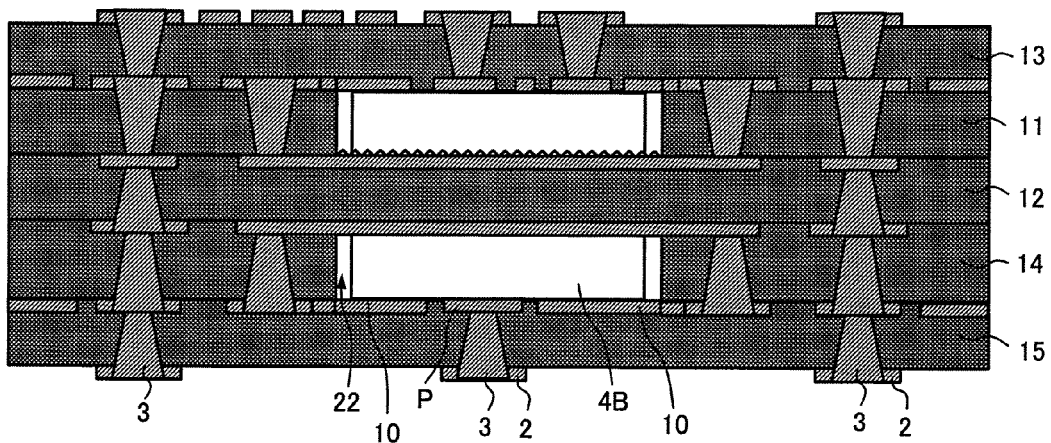

FIG. 4L is a cross-sectional view of the multilayer wiring substrate where electronic component (4B) is accommodated in lower concave portion 22, insulation layer 15 is laminated and conductive circuit 2 is formed. Through the same manner described in the steps with reference to FIGS. 4G and 4H, electronic component (4B) is accommodated in concave portion 22 and conductive layer 10 is formed, then insulation layer 15 and copper foil 6 are laminated. By conducting the same process described in the steps with reference to FIGS. 4B-4D, the following are formed: vias 3 which are electrically connected to the intermediate layer formed on connection pads (P) of the built-in electronic component (4B); vias 3 which are electrically connected to conductive circuit 2 including vias 3 formed in the substrate for accommodating a semiconductor element; and conductive circuit 2 formed on the outer side.

Furthermore, by laminating insulation layers and copper foils and repeating the same process with reference to FIGS. 4J-4L, a multilayer printed wiring board with further multiple laminated layers may be obtained.

Figure 4M:
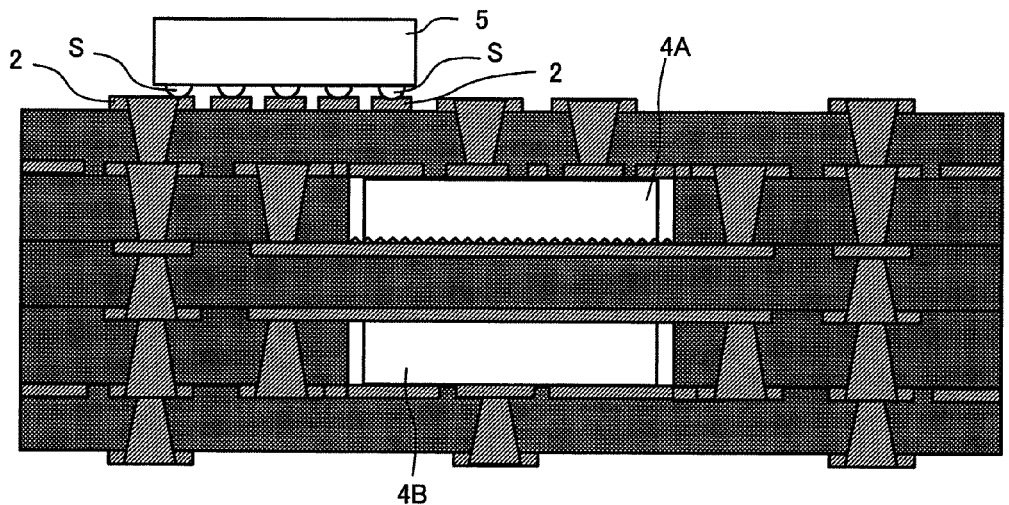

Next, electronic component 5 is mounted on the surface of the substrate. FIG. 4M is a cross-sectional view of the multilayer wiring board with mounted electronic component 5 on the surface. On each surface of the multilayer wiring substrate, a solder resist layer is formed. Here, on the entire outer surface of the multilayer wiring substrate, solder-resist compound is applied, the coated film is dried, then a photomask is placed on which opening portions of the solder pads are drawn, and the film is exposed to light and developed. Accordingly, solder-pad openings are each formed through which conductive-pad portions are exposed directly on vias 3 of conductive circuit 2. In such a case, openings may be made by pasting a dry film made from solder-resist layer, which is then exposed to light and developed, or processed by laser irradiation.

On the solder pads exposed through where the mask layer is not formed, a corrosion-resistant layer such as a nickel-gold layer is formed. Here, the thickness of the nickel layer is preferred to be in the range of 1-7 μm and the thickness of the gold layer is preferred to be in the range of 0.01-0.1 μm. As for a corrosion-resistant layer, other than a nickel-gold layer, nickel-palladium-gold, gold (single layer) or silver (single layer) may be formed. After forming a corrosion-resistant layer, the mask layer is removed. By doing so, a printed wiring board is obtained where solder pads with a corrosion-resistant layer and solder pads without a corrosion-resistant layer are mixed.

Solder body is supplied for the portions of the solder pads exposed directly on the vias through solder-resist openings, and is then melted and solidified to form solder bumps (S). Alternatively, conductive balls or conductive pins are bonded to the pad portions using a conductive bonding agent or solder layer. Accordingly, multilayer wiring board 1 is obtained. As for a method of supplying solder body and a solder layer, a solder transcription method or printing method may be used.

A solder transcription method is conducted as follows: By pasting solder foil on a prepreg and by etching the solder foil except the portions corresponding to the openings, a solder pattern is formed and a solder carrier film is obtained. After applying flux to the solder-resist opening portions of the substrate, the solder carrier film is laminated so that the solder pattern touches the pads. Then, the film is heated to transcribe the pattern.

On the other hand, a printing method is conducted by placing a printing mask (metal mask) having openings in the portions corresponding to pads, then by printing solder paste and heating. As for the solder to form such solder bumps, Sn/Ag solder, Sn/In solder, Sn/Zn solder or Sn/Bi solder may be used. The melting point of such solder is preferred to be lower than that of the conductive bumps connecting each laminated circuit substrate.

By placing electronic component 5 on the printed solder paste and adding heat, electronic component 5 is bonded by solder on conductive circuit 2 on the surface. Electronic component 5 is mounted on the surface of the multilayer wiring substrate facing the bottom of at least one concave portion 22. Electronic component 5 mounted on the surface and electronic component (4B) accommodated in concave portion 22 are electromagnetically shielded and thus mutual electromagnetic interference is prevented.

In the above-described method, insulation layers and conductive circuits were made multilayered by laminating an insulation layer and a copper foil one after another. However, by forming multiple units of circuit substrates, with a unit having two or more layers of insulation layers, and by thermopressing them all at once, a multilayer wiring board may be obtained in which multiple insulation layers and conductive circuits are laminated.

In Embodiment 1, since electromagnetic shields around concave portions 21, 22 are formed using filled vias 41, 42, they may be processed at the same time as vias connecting conductive circuits. On the sides of the concave portions, it is not necessary to form conductive layers by plating or the like. Thus, a step will not be added to form electromagnetic shielding.

Also, conductive layer 31 may be formed with material having greater absorption loss than wiring material to form conductive circuits. Conductive circuit (10a) may be formed with material having reflection loss the same as, or greater than, the wiring material to form conductive circuits. For example, when wiring is made of copper, conductive layer 31 is made of iron and conductive layer (10a) is made of silver, copper or aluminum. By forming the bottom and side surfaces of a concave portion with material having large absorption loss of electromagnetic waves, electromagnetic waves radiated from the electronic component embedded in the multilayer wiring board are reduced. By forming a surface positioned opposite so as to sandwich any insulation layer on the bottom side of the concave portion, using material having great reflection loss of electromagnetic waves, the impact from external electromagnetic waves is suppressed and an electromagnetic shielding effect is achieved.

Conductive layer 31 formed on the bottom or a side of concave portion 21 may be made of material having less reflection loss of electromagnetic waves or greater absorption loss of conductive electromagnetic waves than conductive layer (10a) positioned opposite so as to sandwich any insulation layer on the bottom side of concave portion 21. Furthermore, based on the position of conductive layer 31 formed on the bottom or a side of concave portion 21, the layer positioned opposite so as to sandwich any insulation layer on the bottom side of concave portion 21 may be conductive layer 32. Conductive layer 31 is made of material having less reflection loss of electromagnetic waves or greater absorption loss of electromagnetic waves than conductive layer 32.

At concave portions 21, 22, when selecting material for conductive layer (31, 32, 10a, 10b) by considering the amount of reflection loss or absorption loss of electromagnetic waves, it is sufficient if the combination is such that electronic components (4A, 4B) built in concave portions 21, 22 are protected from interference by electromagnetic waves. Selection of material along with surface roughening treatment on conductive layers 31, 32 may enhance the electromagnetic shielding effect.

Embodiment 2

FIG. 5 is a cross-sectional view of multilayer wiring board 1 according to Embodiment 2 of the present invention. In Embodiment 2, electromagnetic shielding layers around concave portions 21, 22 are structured with conductive layers 51, 52 formed by plating the side surfaces of concave portions 21, 22 and conductive layers 61, 62 formed by plating to cover conductive layers 31, 32, 51, 52.

Multilayer wiring board 1 is structured with multiple insulation layers 11, 12, 13, 14, 15 conductive circuits 2 separated by insulation layers 11, 12, 13, 14, 15 and vias 3 electrically connecting conductive circuits 2. In multilayer wiring board 1 according to Embodiment 2 of the present invention, concave portions 21, 22 are formed in sections of insulation layers 11, 14. On the surface of insulation layer having concave portions 21, 22 respectively, conductive layer 9 is formed, and conductive layer 10 is positioned opposite so as to sandwich any insulation layer on the bottom sides of concave portions 21, 22. Also, conductive layers 31, 32 are formed on the bottom of concave portions 21, 22. In addition, conductive layers 51, 52 are formed on the sides of concave portions 21, 22. Embodiment 2 is the same as Embodiment 1 except for the following: electromagnetic shields around concave portions 21, 22 are structured with conductive layers 51, 52 formed on the side surfaces of concave portions 21, 22; there are conductive layers 61, 62 formed by plating to cover conductive layers 31, 32, 51, 52; and the electromagnetic shielding layers are structured with two or more layers.

Conductive layers 51, 52 formed on the side surfaces of concave portions 21, 22 are electrically connected to conductive layers 31, 32 on the bottom of the concave portions. Conductive layers 61, 62 formed to cover conductive layers 31, 32, 51, 52 are also electrically connected. Since those conductive layers 31, 32, 51, 52, 61, 62 are electrically continuous, they have the same electrical potential. Conductive layers 31, 32, 51, 52, 61, 62 may be connected to, for example, ground (earth) and be maintained at the base electrical potential of multilayer wiring board 1, or may be maintained at the base electrical potential of multilayer wiring board 1 through conductive layers 9 which are formed to be connected to conductive layers 31, 32, 51, 52, 61, 62.

In each concave portion, electronic component (4A or 4B) is embedded. Electronic components (4A, 4B) embedded in concave portions 21, 22 are connected to conductive circuits 2 through vias 3 formed in insulation layers 13, 15 on concave portions 21, 22. In addition, electronic component 5 is also mounted on the surface layer of multilayer wiring board 1. Electronic component 5 mounted on the surface layer is connected to conductive circuit 2 on the surface layer through solder bumps (S) formed on the conductive circuit.

The depths of concave portions 21, 22 formed in insulation layers (11a, 11b, 14) are set according to the configurations of electronic components (4A, 4B) to be embedded there. For example, as shown in concave portion 21 in the upper portion of FIG. 5, concave portion 21 may be formed extending through two or more layers (11a, 11b). In such a case, conductive layers 51 for electromagnetic shielding are formed at least to extend the entire height of the concave portion.

Conductive layers 61, 62 formed to cover conductive layers 31, 32, 51, 52 on the bottom and side surfaces of concave portions 21, 22 surround the entire external surfaces except the top surfaces having connection pads (P) of electronic components (4A, 4B) embedded in concave portions 21, 22. Accordingly, in directions parallel to side and bottom surfaces of electronic components (4A, 4B), electromagnetic shielding effects may be achieved simultaneously. Two electronic components (4A, 4B) in FIG. 5 are separated from each other by conductive layers 31, 32, and the peripheries of concave portions 21, 22 are surrounded by conductive layers 51, 52 and covered by conductive layers 61, 62. Therefore, electronic component (4A) in upper concave portion 21 and electronic component (4B) in lower concave portion 22 in FIG. 5 are electromagnetically shielded from each other.

Exposed surfaces of conductive layers 61, 62 or exposed surfaces of conductive layers 31, 32, 51, 52 in the area not covered by conductive layers 61, 62 may be roughened. Roughening treatment is conducted by a black oxide treatment, a chemical etching treatment, a matting treatment or a sandblasting method. Also, conductive layers 61, 62 may be formed with material having less reflection loss of electromagnetic waves than conductive layers 31, 32, 51, 52; for example, copper for conductive layers 31, 32, 51, 52 and nickel or gold for conductive layers 61, 62. In addition, other combinations may include: iron or aluminum for conductive layers 31, 32, 51, 52 and iron for conductive layers 61, 62.

Alternatively, conductive layers 61, 62 may be formed with material having greater absorption loss than conductive layers 31, 32, 51, 52; for example, copper for conductive layers 31, 32, 51, 52 and silver or iron for conductive layers 61, 62. Other combinations may include: nickel or aluminum for conductive layers 31, 32, 51, 52 and copper for conductive layers 61, 62.

By forming inside the concave portion with material having small reflection loss and outside the concave portion with material having greater reflection loss than the inner layer, electromagnetic waves radiated from the electronic component embedded in the multilayer wiring board may be reduced and impact from external electromagnetic waves may be suppressed.

Alternatively, by forming inside the concave portion with material having large absorption loss and outside the concave portion with material having less absorption loss than the inner layer, electromagnetic waves radiated from the electronic component embedded in the multilayer wiring board may be suppressed and impact from external electromagnetic waves may be reduced.

Furthermore, by forming either layer of the two or more layers that make the concave portion with material having less reflection loss of electromagnetic waves, or material having greater absorption loss of electromagnetic waves, than the conductive layer positioned opposite so as to sandwich any insulation layer on the bottom side of the concave portion, a high shielding effect is achieved. If material is selected by considering reflection loss or absorption loss when forming conductive layers, compared to a case in which a single-layer conductive layer is formed using either material, a high-shielding effect is achieved at the conductive layers.

Same as in Embodiment 1, for example, as shown in FIG. 3, even if two concave portions 21, 22 do not entirely overlap, since the peripheries of concave portions 21, 22 are surrounded by conductive layers 61, 62 or conductive layers 51, 52, concave portions 21, 22 are electromagnetically shielded from each other. Also, electronic component 5 mounted on the surface layer of multilayer wiring board 1 and electronic component (4B) embedded at least in one concave portion 22 are electromagnetically shielded from each other.

Figure 6A:
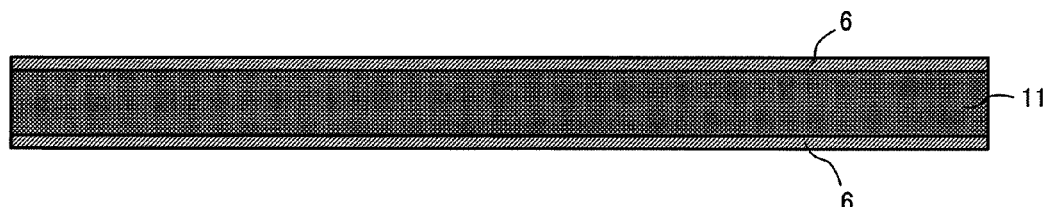
FIGS. 6A-6O are cross-sectional views partially showing the steps of manufacturing a multilayer wiring board according to an embodiment of the present invention.

Next, the steps of manufacturing a multilayer wiring board are described in which the peripheries of concave portions 21, 22 are shielded by conductive layers 51, 52, and electromagnetic shielding layers are formed using conductive layers 61, 62 to cover conductive layers 31, 32 and conductive layers 51, 52. FIGS. 6A-6O are cross-sectional views partially illustrating the steps of manufacturing multilayer wiring board 1 according to Embodiment 2 of the present invention. In Embodiment 2, as for electromagnetic shielding for the peripheries of concave portions 21, 22, conductive layers 51, 52 formed on the side surfaces of concave portions 21, 22 are used instead of arrays of filled vias. There are conductive layers 61, 62 formed by plating so as to cover conductive layers 31, 32, 51, 52, and electromagnetic shielding layers are structured with two or more layers. Since the rest is the same as in Embodiment 1, descriptions are omitted for the common parts.

FIG. 6A is a cross-sectional view of a double-sided copper-clad laminate. The double-sided copper-clad laminate is formed using, for example, a laminate in which copper foils 6 are laminated on both surfaces of insulation layer 11. On one surface of such a double-sided copper-clad laminate, laser is irradiated to form via openings 7 which penetrate copper foil 6 on one surface and insulation layer 11 to reach the back surface of copper foil 6 on the other surface.

Figure 6B:
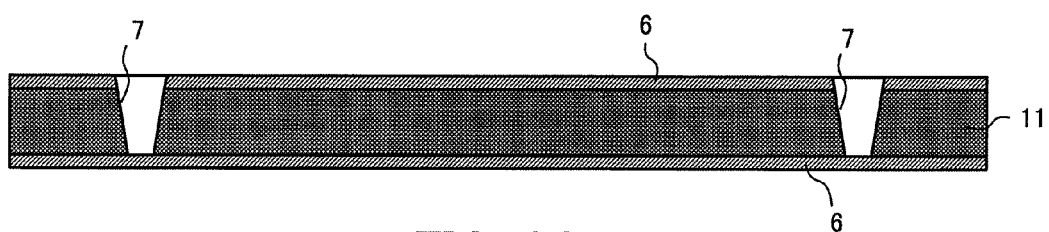

FIG. 6B is a cross-sectional view of the double-sided copper-clad laminate in which via openings are formed. In Embodiment 2, via openings 7 are for making a connection to conductive circuits 2. To remove resin residue remaining inside via openings, a desmear treatment is preferred to be carried out.

Figure 6C:
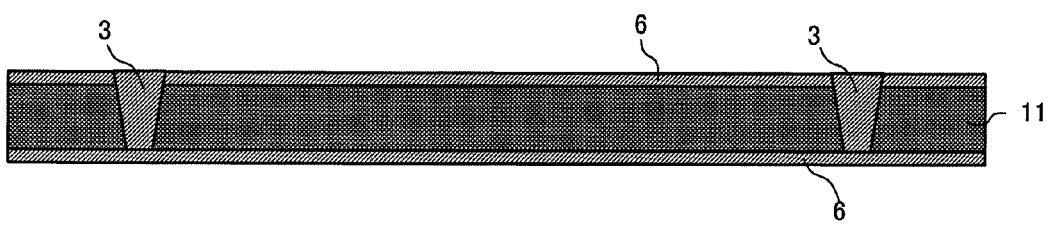

FIG. 6C is a cross-sectional view of the double-sided copper-clad laminate in which metal is filled in via openings 7. For via openings 7 of the substrate after the desmear treatment is done, electrolytic copper plating is performed with copper foil 6 as a plating lead, and vias 3 are formed by completely filling electrolytic copper plating inside via openings 7.

Figure 6D:
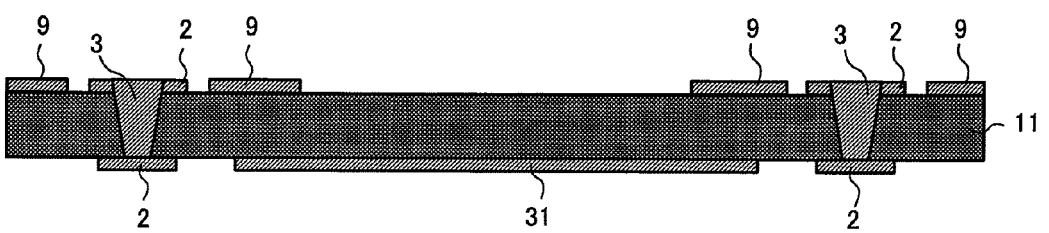

FIG. 6D is a cross-sectional view of the wiring substrate having conductive circuits 2 on both surfaces and conductive layer 31. By etching copper foils 6 on both surfaces of the double-sided copper-clad laminate: on one surface of insulation layer 11, conductive circuit 2 including via lands, an alignment mark for aligning positions and others are formed; on the other surface, conductive layer 31 having a size in relation to concave portion 21 for accommodating electronic component (4A), conductive circuit 2 including via lands, conductive circuit 9 to cover the surface of the insulation layer, an alignment mark for aligning positions and others are formed.

Figure 6E:
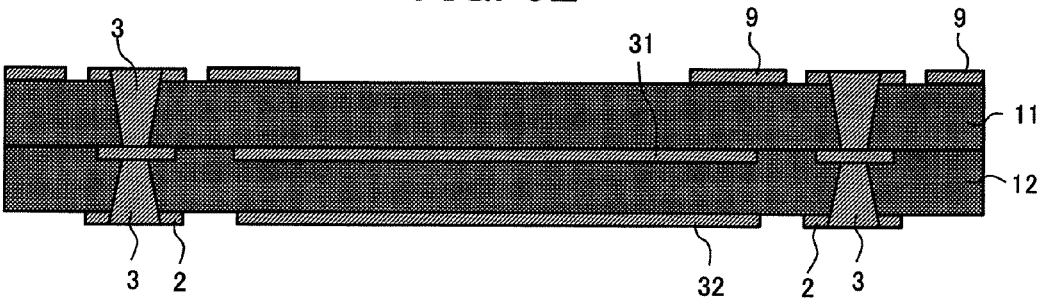

FIG. 6E is a cross-sectional view of the wiring substrate in which vias 3 in insulation layer 12 and conductive circuit 2 are formed. On the surface where conductive layer 31 is formed on insulation layer 11, conductive layer 12 and copper foil 6 are laminated. Regarding insulation layer 12, vias 3 and conductive circuit 2 are formed in the same manner for the double-sided copper clad laminate. At the same time, conductive layer 32 is also formed as the bottom surface of concave portion 22 which will be formed in the lower portion.

Figure 6F:
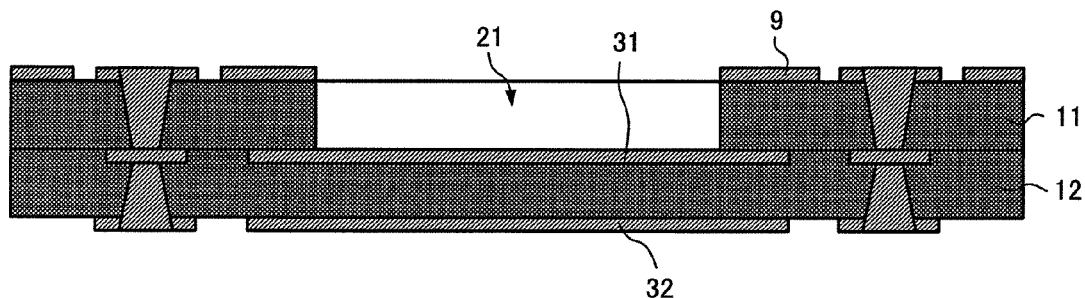

FIG. 6F is a cross-sectional view of the multilayer wiring substrate in which concave portion 21 to accommodate electronic component (4A) is formed. On the surface region (concave-portion forming region) of insulation layer 11 which is opposite the surface where conductive layer 31 is formed, an opening is formed by, for example, a laser process so as to penetrate the resin layer and reach the surface of the conductive layer. Then, concave portion 21 is formed through which the surface of the conductive layer is exposed. Accordingly, a substrate to accommodate an electronic component is obtained.

Figure 6G:
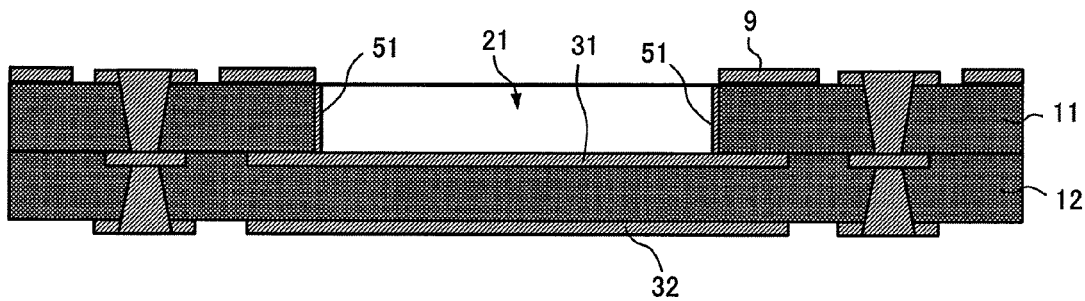

FIG. 6G is a cross-sectional view of the multilayer wiring substrate in which conductive layers 51 are formed on the side surfaces of concave portion 21. On both surfaces of the multilayer wiring substrate, resist layers are formed. For example, resist layers are formed by laminating a 15 μm-thick dry-film resist, and a non-resist forming portion is formed where concave portion 21 formed in insulation layer 11 and its opening-periphery portion are exposed.

By applying palladium catalyst on the surface of the non-resist forming portion, catalytic nuclei are stuck on the surfaces of the inner-walls and the opening-periphery portion of concave portion 21. Next, by immersion in an electroless copper plating solution, electroless copper-plated film with a thickness in the range of, for example, 0.5-3.0 μm is formed on the surfaces of the inner walls and the opening-periphery portion of concave portion 21. Then, using an electrolytic copper plating solution and under plating conditions, electrolytic plating is performed to form an electrolytic copper-plated film on the non-resist forming portion. After that, by removing the plating resist using an alkaline solution, a metal layer for shielding made of an electroless copper-plated film and an electrolytic copper-plated film is formed on the inner-wall surfaces (bottom surface and side surfaces) of concave portion 21 and the opening-periphery portion of concave portion 21. Here, conductive layer 31 having a flat surface exposed at the bottom of concave portion 21 and the surfaces of conductive layers 51 are covered with an electroless copper-plated film, then on the electroless copper-plated film, an electrolytic copper-plated film is formed. Accordingly, a metal layer for shielding is formed.

Figure 6H:
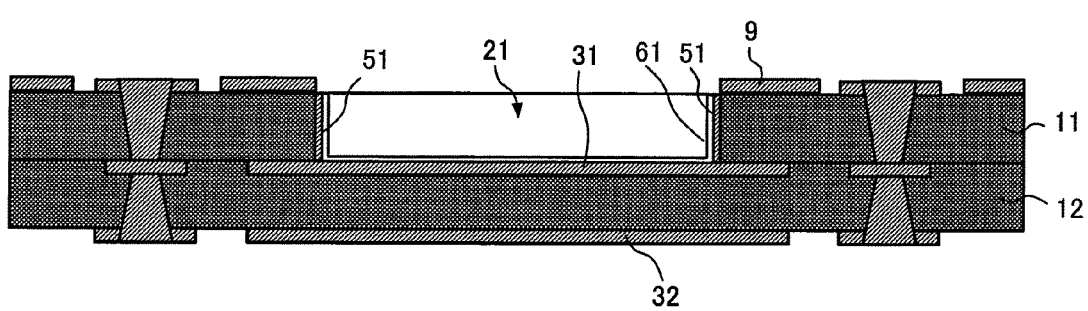

FIG. 6H is a view where conductive layer 61 is formed. As conductive layer (61), a plating layer is formed to cover conductive layer 31 formed on the bottom of the concave portion and conductive layers 51 formed on the side surfaces of the concave portion.

For example, if conductive layers 31, 51 are made of copper and conductive layer 61 is formed by nickel plating, after washing with water and removing grease with an acidic solution, soft-etching is conducted. Then, by immersion in an electroless nickel plating solution (an acidic solution containing nickel chloride, sodium hypophosphite and sodium citrate) for 20 minutes, a 5 μm-thick nickel-plated layer is formed.

Alternatively, if conductive layers 31, 51 are made of copper and conductive layer 61 is formed by gold plating, after washing with water and removing grease with an acidic solution, soft-etching is conducted. Then, by immersion in an electroless gold plating solution (a solution containing gold potassium cyanide, ammonium chloride, sodium hypophosphite and sodium citrate) at 80° C. for 7.5 minutes, a 0.03 μm-thick gold-plated layer is formed.

Alternatively, if conductive layers 31, 51 are made of copper and conductive layer 61 is formed by silver plating, silver paste is applied on the copper surface, or a copper foil with plated silver is laminated to form a silver-plated layer.

If conductive layer 61 is formed on either the bottom surface or side surface only, the surface of the concave portion where conductive layer 31 on the bottom of the concave portion or 51 on the side surface of the concave portion is exposed may be roughened through a black oxide or a chemical etching treatment. Depending on the material of conductive layer 61, the surface of conductive layer 61 may be roughened as well. Also, if the thickness of conductive layer 61 is sufficiently small compared with the roughness of a roughened surface and a direct surface roughening is impossible, conductive layer 61 is formed after roughening the surfaces of conductive layers 31, 51. Accordingly, the surfaces of the concave portion may be roughened.

Figure 6I:
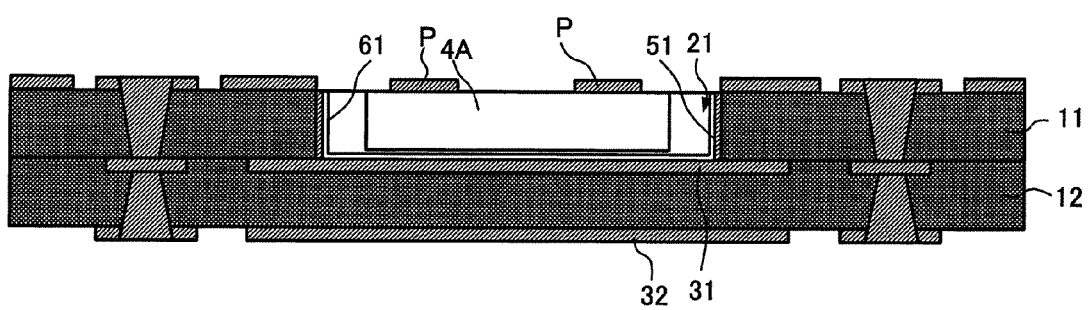

FIG. 6I is a cross-sectional view of the multilayer wiring substrate in which electronic component (4A) is accommodated in concave portion 21. In the substrate for accommodating an electronic component obtained through the steps to FIG. 6G, electronic component (4A), for example, a semiconductor element, is embedded.

Figure 6J:
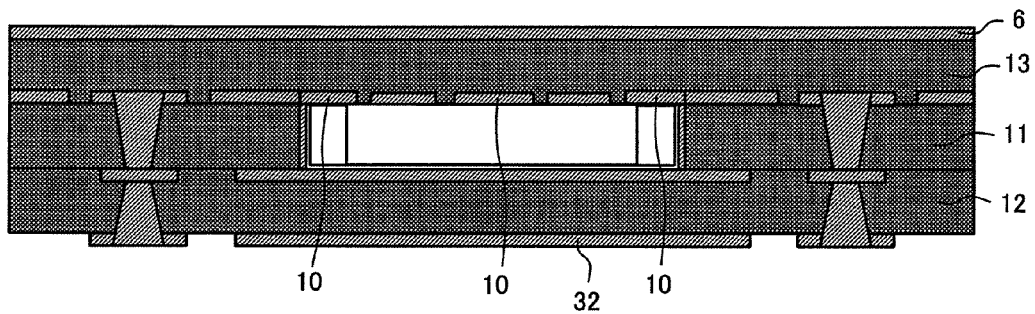

FIG. 6J is a cross-sectional view of the multilayer wiring substrate in which insulation layer 13 is formed on the layer where electronic component (4A) is accommodated. On the substrate where electronic component (4A) is accommodated and built-in, insulation layer 13 and copper foil 6 are laminated in the same manner as in laminating insulation layer 12 and copper foil 6.

Figure 6K:
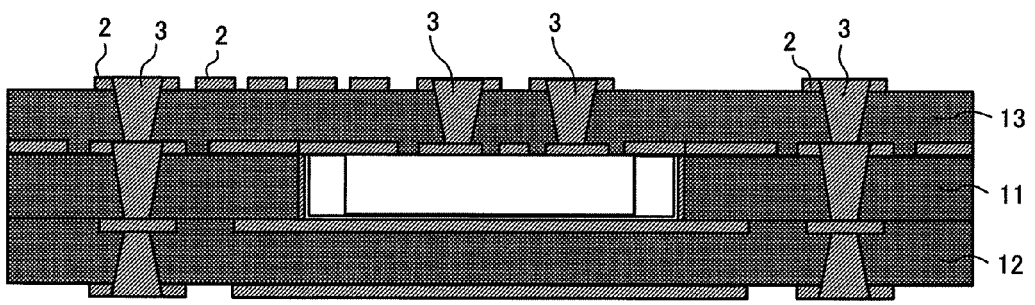

FIG. 6K is a cross-sectional view of the multilayer wiring substrate in which conductive circuit 2 is formed on the surface layer. After laminating insulation layer 13 and copper foil 6, by conducting the same steps described with reference to FIGS. 6B-6D, vias 3 electrically connected to the intermediate layer formed on connection pads (P) of built-in electronic component (4A), conductive circuit 2 on the external side and conductive layer 10 are formed. Conductive layer 10 is formed to cover the surface of electronic component (4A) without being connected to connection pads (P) and conductive circuit 2.

Figure 6L:
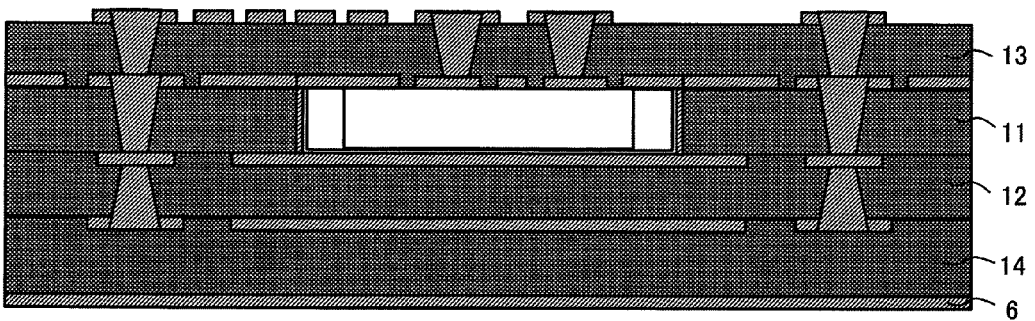

FIG. 6L is a cross-sectional view of the multilayer wiring substrate where insulation layer 14 is formed in which concave portion 22 is formed for accommodating electronic component (4B). Insulation layer 14 and copper foil 6 are laminated in the same manner as in laminating insulation layer 12 and copper foil 6.

Figure 6M:
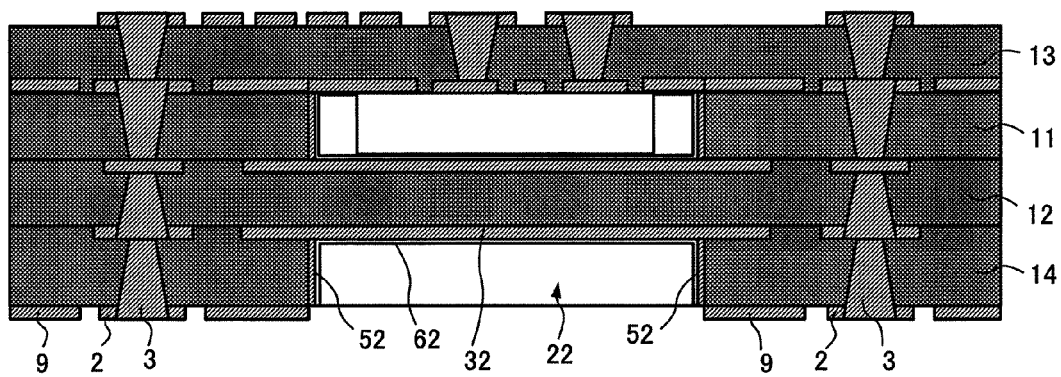

FIG. 6M is a cross-sectional view of the multilayer wiring substrate in which vias 3, conductive circuit 2, concave portion 22 and conductive layers 52 on the side surfaces of the concave portion are formed in regard to insulation layer 14 laminated in FIG. 6L. By conducting the same steps described with reference to FIGS. 6B-6D, FIG. 6F and FIG. 6G, the following are formed: vias 3 to be connected to conductive circuit 2, concave portion 22, conductive layers 52 on the side surfaces of the concave portion and conductive layer 9. The bottom surface of concave portion 22 is conductive layer 32 which was formed through the step to form conductive circuit 2 in FIG. 6E. Conductive layer 62 may be formed to cover conductive layer 32 and conductive layers 52 the same as in FIG. 6H, and the surfaces of conductive layers 32, 52, 62 that form the surfaces of the concave portion may be roughened.

Figure 6N:
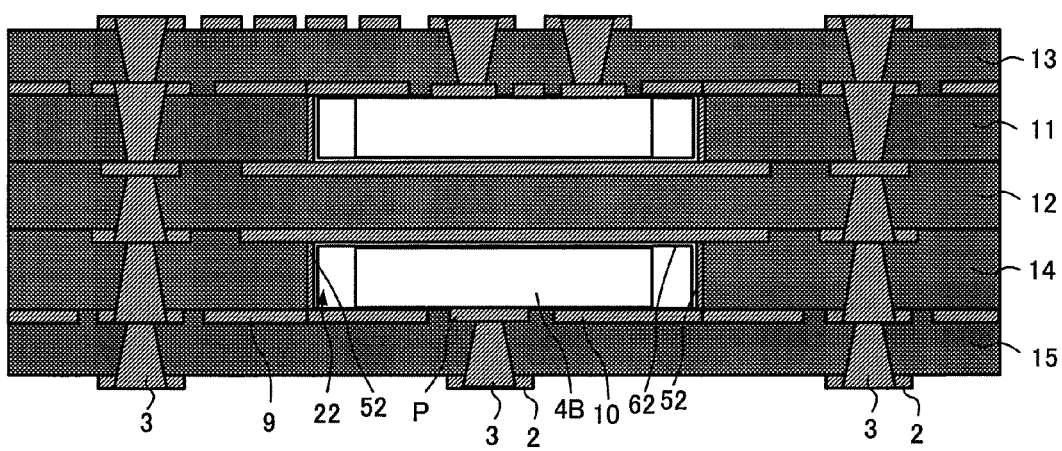
Figure 6O:
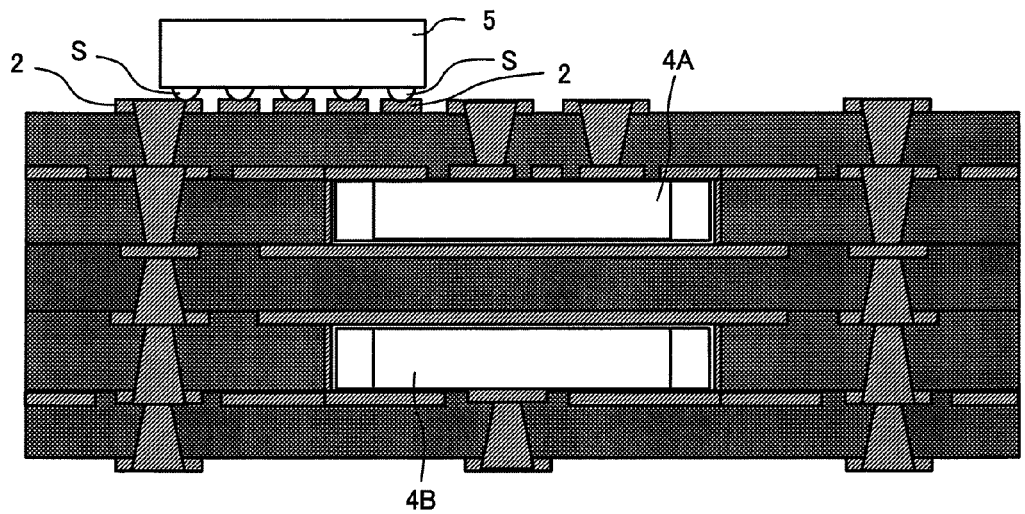

FIG. 6N is a cross-sectional view of the multilayer wiring substrate where electronic component (4B) is accommodated in the lower concave portion 22 on which insulation layer 15 is laminated and conductive circuit 2 is formed. By conducting the same steps described with reference to FIGS. 6I and 6J, electronic component (4B) is accommodated in concave portion 22, and after forming conductive layer 10 insulation layer 15 and copper foil 6 are laminated. By conducting the same steps described with reference to FIGS. 6B-6D, the following are formed: vias 3 electrically connected to the intermediate layer formed on connection pads (P) of built-in electronic component (4B), vias 3 electrically connected to conductive circuit 2 including vias 3 formed on the multilayer wiring substrate, and conductive circuit 2 on the outer side.

An insulation layer and a copper foil are further laminated and by repeating the same process shown in FIGS. 6L-6N, a multilayer wiring substrate having further multiple layers is obtained.

Next, electronic component 5 is mounted on the surface of the multilayer wiring substrate. FIG. 6O is a cross-sectional view of the multilayer wiring board with mounted electronic component 5 on the surface. On each surface of the multilayer wiring substrate, a solder-resist layer is formed. On the solder-pad portions exposed directly on the vias through solder-resist openings, solder body is supplied. Solder bumps (S) are formed by melting and solidifying the solder body. Alternatively, by bonding conductive balls or conductive pins to the pad portion using conductive adhesive agent or solder layer, a multilayer wiring board is formed. As for a method of supplying solder body or a solder layer, a solder transcription method or a printing method may be used.

By placing electronic component 5 on the printed solder paste and adding heat, electronic component 5 is bonded by solder to conductive circuit 2 on the surface. The electronic component is mounted on the surface positioned opposite the bottom surface of at least one concave portion 22. Electronic component 5 mounted on the surface and electronic component (4B) accommodated in concave portion 22 are electromagnetically shielded, thus electromagnetic interference is prevented between each other.

In Embodiment 2, conductive layer 61 which appears as the surface layer of concave portion 21 may be made of material having less reflection loss of electromagnetic waves than conductive layers 31, 51 that structure concave portion 21 but are not surface layers; for example, copper for conductive layers 31, 51 and nickel or gold for conductive layer 61. Other combinations may include silver or aluminum for conductive layers 31, 51 and iron for conductive layer 61.

Alternatively, conductive layer 61 may be made of material having greater absorption loss of electromagnetic waves than conductive layers 31, 51: for example, copper for conductive layers 31, 51 and silver or iron for conductive layer 61. Other combinations may include nickel or aluminum for conductive layers 31, 51 and copper for conductive layer 61.

Alternatively, either layer of conductive layers 31, 51, 61, which are two or more layers that structure concave portion 21, may be made of material having less reflection loss of electromagnetic waves, or greater absorption loss of electromagnetic waves, than conductive layer (10a) positioned opposite so as to sandwich any insulation layer on the bottom side of the concave portion. For example, if reflection loss is considered when selecting material, copper is chosen for conductive layer (10a) and nickel or gold for conductive layers 31, 51, 61. Other combinations may include silver or aluminum for conductive layer (10a) and iron for conductive layers 31, 51, 61. If absorption loss is considered when selecting material, copper is chosen for conductive layer (10a) and silver or iron for conductive layers 31, 51, 61. Other combinations may include nickel or aluminum for conductive layer (10a) and copper for conductive layers 31, 51, 61.

When forming conductive layers, conductive layers (31, 51, 61, 10a) with reference to concave portion 21 may be read as conductive layers (32, 52, 62, 10b) with reference to concave portion 22 and the material may be selected in the same manner.

Furthermore, conductive layer (10a) and conductive layer (9b), or conductive layer (10b) and conductive layer (9a), may be formed on the same insulation layer, connected to the same base electrical potential and made of the same material.

In Embodiment 2, if conductive layers are structured with two or more layers and the inside of the concave portion is made of material having small reflection loss, and the outside is made of material having greater reflection loss than the inner layer; or if the inside of the concave portion is made of material having large absorption loss and the outside is made of material having less absorption loss than the inner layer, then the conductive layers show a high-shielding effect compared with a case when single-layer conductive layers are formed using either material.

Furthermore, if any one of the two or more layers forming the concave portion is made of material having less reflection loss of electromagnetic waves, or greater absorption loss of electromagnetic waves, than the conductive layer positioned opposite so as to sandwich any insulation layer on the bottom side of the concave portion, then the conductive layers show a high-shielding effect compared with a case when single-layer conductive layers are formed using either material.

Modified Example to Embodiment 1

Figure 7:
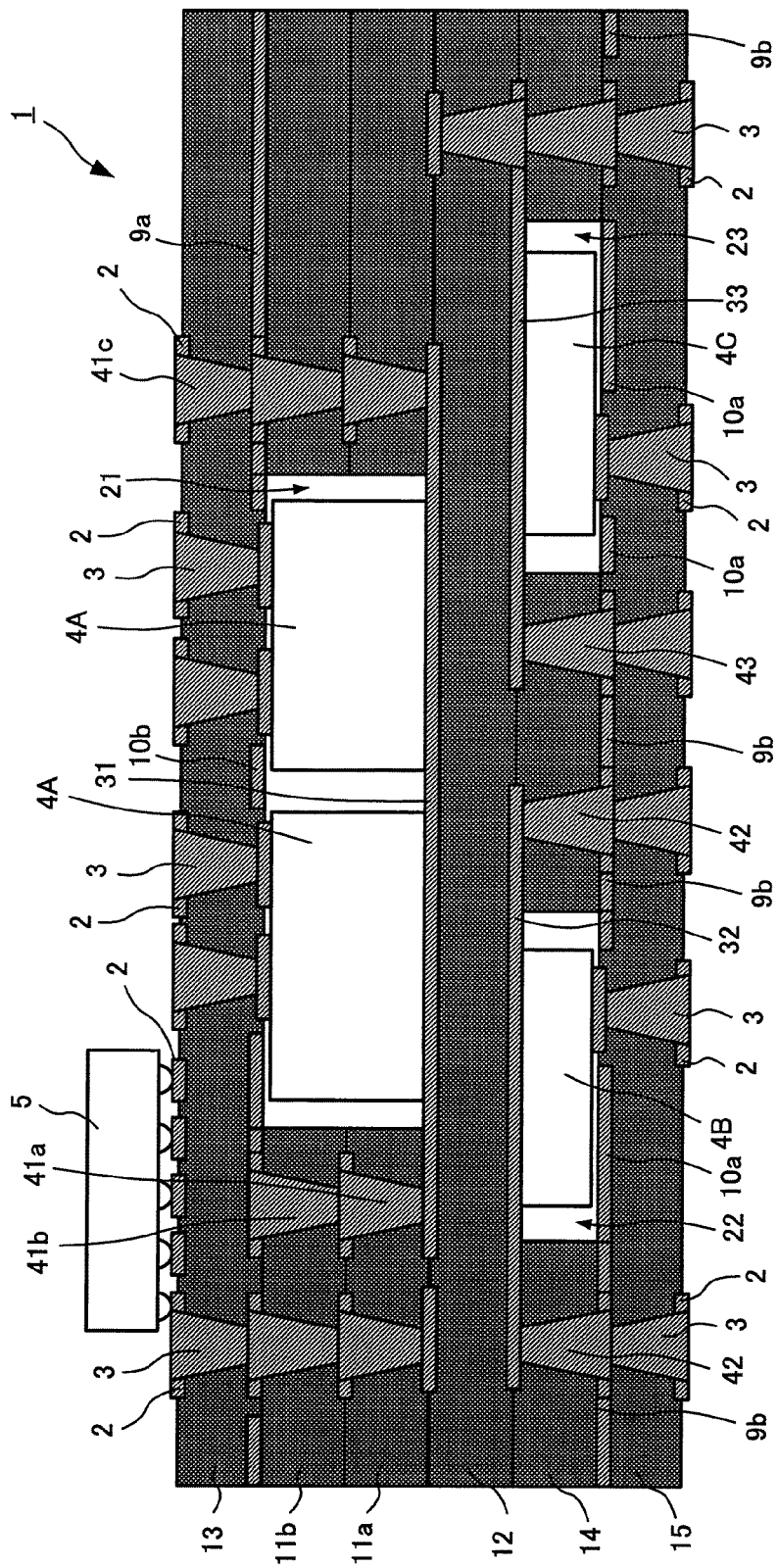
FIG. 7 is a cross-sectional view showing a sample structure of a multilayer wiring board in which two concave portions are formed in an insulation layer according to an embodiment of the present invention.

FIG. 7 is a cross-sectional view of multilayer wiring board 1 showing a case in which filled vias are used to electromagnetically shield the concave portions, and two concave portions are formed in one insulation layer. In one insulation layer 14, two concave portions 22, 23 are formed simultaneously. In concave portions 22, 23, conductive layers 32, 33 are formed at the bottom respectively. In addition, on the peripheries of concave portions 22, 23, filled vias 42, 43 are arranged to make electromagnetic shielding. In concave portions 22, 23, electronic components (4B, 4C) are accommodated respectively.

Figure 8:
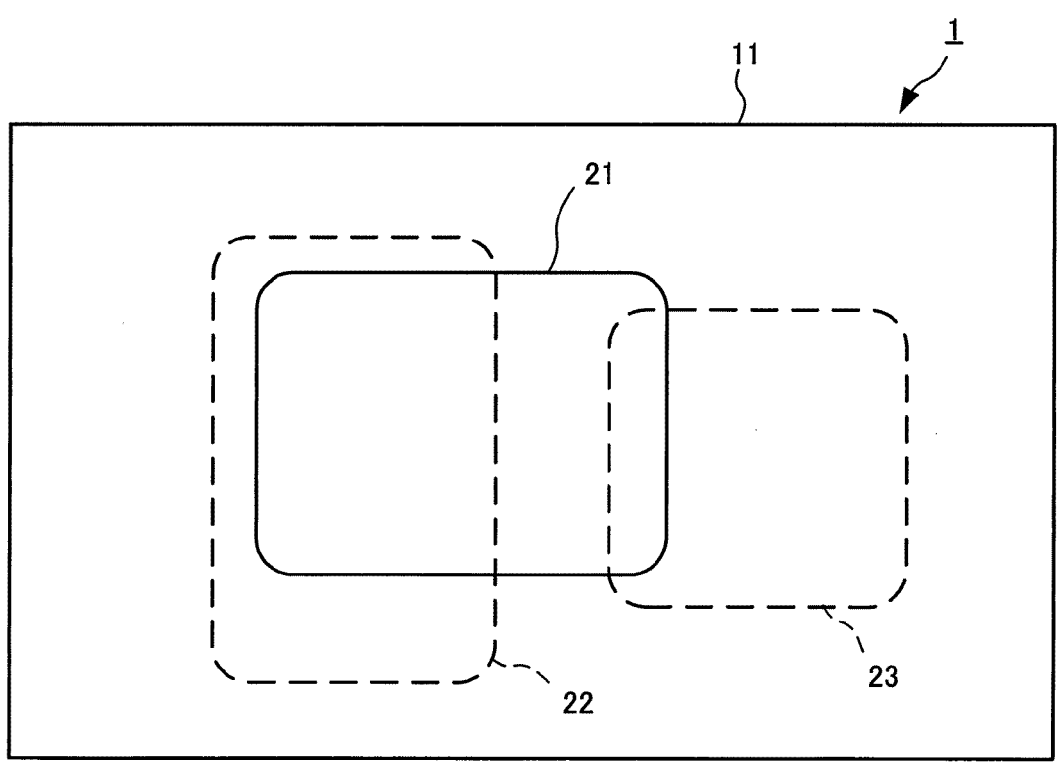
FIG. 8 is a plan view showing an example of the positional relationship of the concave portions in a multilayer printed wiring board according to an embodiment of the present invention.

FIG. 8 is a plan view illustrating the positional relationships of concave portions 21, 22, 23 of the multilayer wiring board shown in FIG. 7. As shown in FIG. 8, if two concave portions do not entirely overlap, since the bottom sides of concave portions 21, 22, 23 are separated by conductive layers 31, 32, 33 and the periphery of each concave portion is surrounded by filled vias 41, 42, 43 respectively, concave portions are electromagnetically shielded from each other. Also, electronic component 5 mounted on the surface layer of multilayer wiring board 1 and electronic components (4B, 4C) embedded in two lower concave portions 22, 23 are electromagnetically shielded from each other.

Modified Example to Embodiment 2

Figure 9:
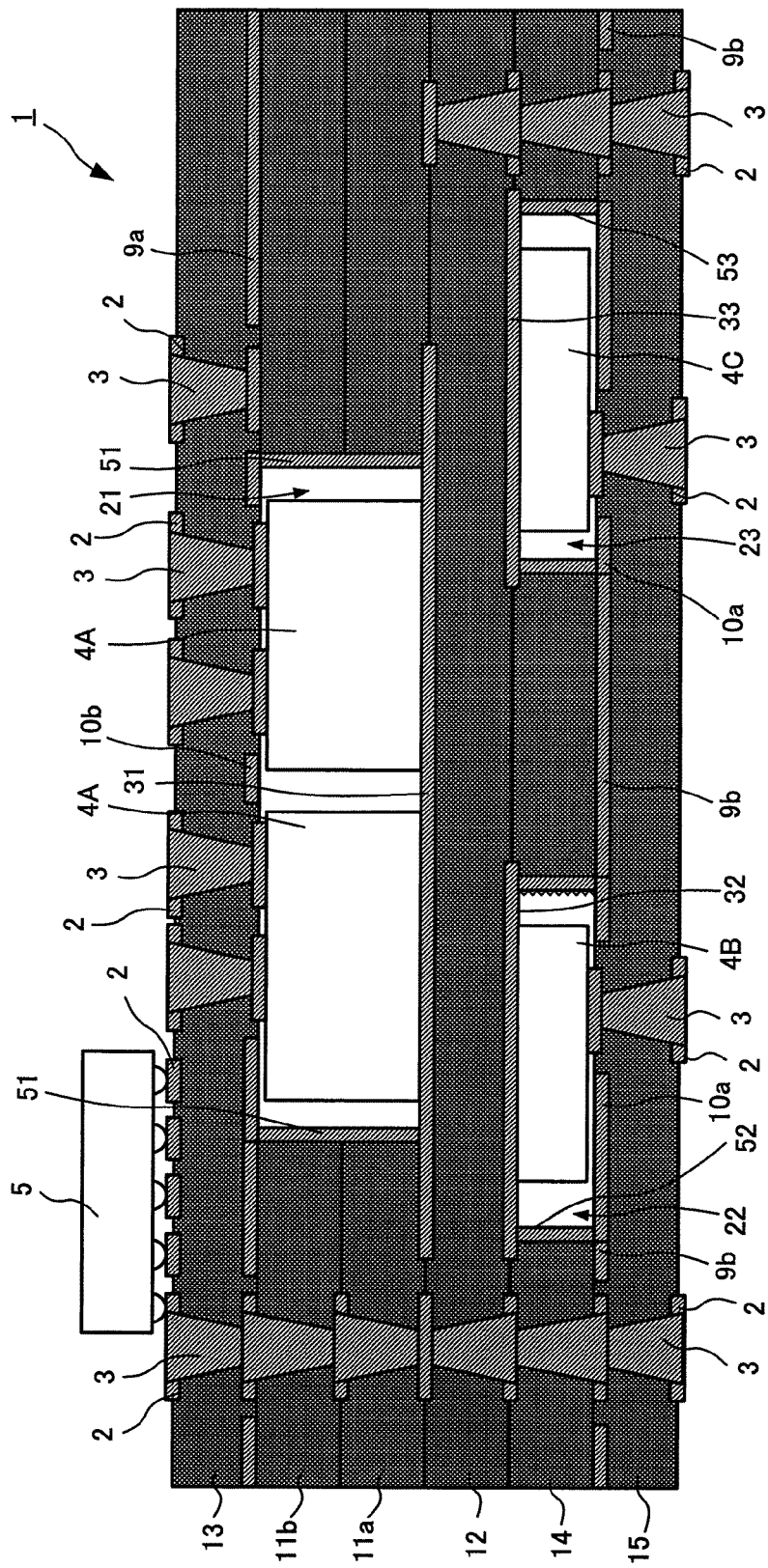
FIG. 9 is a cross-sectional view showing a sample structure of a multilayer wiring board in which two concave portions are formed in an insulation layer according to an embodiment of the present invention.

FIG. 9 is a cross-sectional view of multilayer wiring board 1 showing a case in which conductive layers on the side surfaces of the concave portions are used to electromagnetically shield the concave portions, and two concave portions are formed in one insulation layer. In one insulation layer 14, two concave portions 22, 23 are formed simultaneously. In concave portions 22, 23, conductive layers 32, 33 on the bottom surfaces and conductive layers 52, 53 on the side surfaces are formed respectively. In concave portion 22, 23, electronic component (4B, 4C) may be accommodated respectively.

Conductive layer 52 on the side of concave portion 22 positioned closer to concave portion 23 is roughened. As for the method of roughening the surface, a black oxide treatment, a chemical etching treatment, a matting treatment and a sandblasting method are listed. By roughening the surface of conductive layer 52, electromagnetic waves radiated from electronic component (4B) embedded in concave portion 22 is suppressed from mirror reflection, and thus the impact of the electromagnetic waves on electronic component (4B) and electronic component (4C) built inside concave portion 23 may be reduced.

Also, conductive layers 52 are made of material having less reflection loss of electromagnetic waves than conductive layers 53; or they may be made of material having greater absorption loss of electromagnetic waves than conductive layers 53. Electromagnetic waves radiated from electronic component (4B) are reduced, and the impact of electromagnetic waves from opposite electronic component (4C), positioned to a side of concave portion 22 in the same insulation layer, is suppressed. Accordingly, an electromagnetic shielding effect is achieved. For example, if reflection loss is considered when selecting material, copper is chosen for conductive layer 53 and nickel or gold for conductive layer 52. Other combinations may include silver or aluminum for conductive layer 53 and iron for conductive layer 52. If absorption loss is considered when selecting material, copper is chosen for conductive layer 53 and silver or iron for conductive layer 52. Other combinations may include nickel or aluminum for conductive layer 53 and copper for conductive layer 52.

Regarding conductive layers 52 and conductive layers 53, when selecting material by considering the amount of reflection loss and absorption loss of electromagnetic waves, if a combination of material protects electronic components (4B, 4C) built in concave portions 22, 23 from electromagnetic interference or the like, it is sufficient. Selection of material combined with surface-roughening treatment on conductive layers 52, 53 may enhance the electromagnetic shielding effect.

In such a case, the same as in Modified Example to Embodiment 1, for example, as shown in FIG. 8, even if two concave portions do not entirely overlap, since the peripheries of concave portions 21, 22, 23 are surrounded by conductive layers 31, 32, 33, 51, 52, 53, concave portions are electromagnetically shielded from each other. Also, electronic component 5 mounted on the surface layer of multilayer wiring board 1 and electronic components (4B, 4C) embedded in two lower concave portions 22, 23 are electromagnetically shielded from each other.

As described above, multilayer wiring board 1 according to an embodiment of the present invention has two or more concave portions 21, 22 to accommodate electronic components (4A, 4B), and electromagnetic shielding layers are formed on the bottom surface and side surfaces of concave portions 21, 22 respectively. Thus, electronic components accommodated in concave portions 21, 22 do not electromagnetically interfere with each other. Also, electronic component 5, mounted on the surface layer of the multilayer wiring board positioned opposite the bottom side of one concave portion 22, is electromagnetically shielded between itself and concave portion 22. Thus, electromagnetic interference between electronic component (4B) accommodated in concave portion 22 and electronic component 5 mounted on the surface opposite the bottom side of concave portion 22 may be prevented.

In Embodiments 1 and 2, conductive layers that appear as the surface layers on the bottom and sides of the concave portions may be roughened. Electromagnetic shielding layers formed on the bottom surfaces and their peripheries of the concave portions may be structured with two or more layers. More preferably, the surface layer of the concave portion, which is among the electromagnetic shielding layers structured with two or more layers, is roughened. The surface to be roughened may be either the bottom or side surface; however, to enhance the electromagnetic shielding effect, it is preferred that both surfaces be roughened. Furthermore, if the layer appearing as the surface layer of the concave portion, which is among the electromagnetic shielding layers structured with two or more layers, is made of material having less reflection loss of electromagnetic waves, or greater absorption loss of electromagnetic waves, than any layer other than the surface layer, then an even higher electromagnetic shielding effect may be achieved.

Also, either layer of the electromagnetic shielding layers structured with two or more layers at the concave portion is made of material having greater absorption loss of electromagnetic waves than the wiring material to form conductive circuits. Also, the other electromagnetic shielding layer positioned opposite so as to sandwich any insulation layer on the bottom side of the concave portion is made of material having reflection loss of electromagnetic waves the same as, or greater than, the wiring material to form conductive circuits.

Furthermore, either layer of the electromagnetic shielding layers structured with two or more layers at the concave portion is made of material having less reflection loss of electromagnetic waves, or greater absorption loss of electromagnetic waves, than the other electromagnetic shielding layer positioned opposite so as to sandwich any insulation layer on the bottom side of the concave portion. Here, the opposite electromagnetic shielding layer may form another concave portion.

Also, in Embodiment 1, since electromagnetic shields around concave portions 21, 22 are formed using filled vias 41, 42, they may be formed at the same time as the vias that connect conductive circuits. Since conductive layers are not required to be formed by plating or the like on the side surfaces of the concave portions, a step to form electromagnetic shields is not added. Furthermore, a heat-releasing effect by filled vias 41, 42 may be expected.

The embodiments disclosed here are examples in their entirety, and thus any limit thereof should not be indicated.

EXAMPLES

Figure 10:
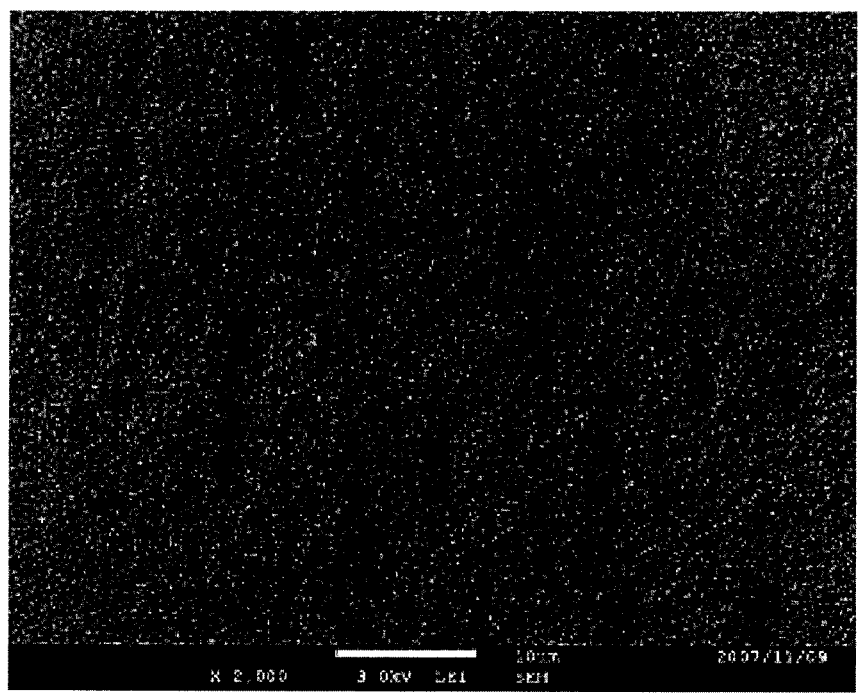
FIGS. 10-12 are images observing the surface conditions of a copper-clad laminate using a scanning electron microscope (pictured at a magnification power of 2,000), where
Figure 11:
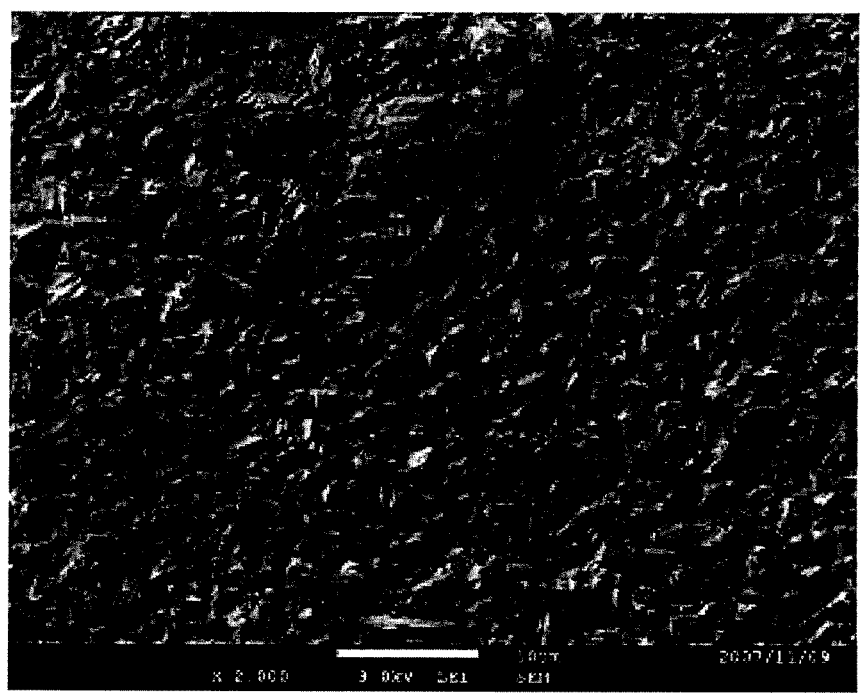
Figure 12:
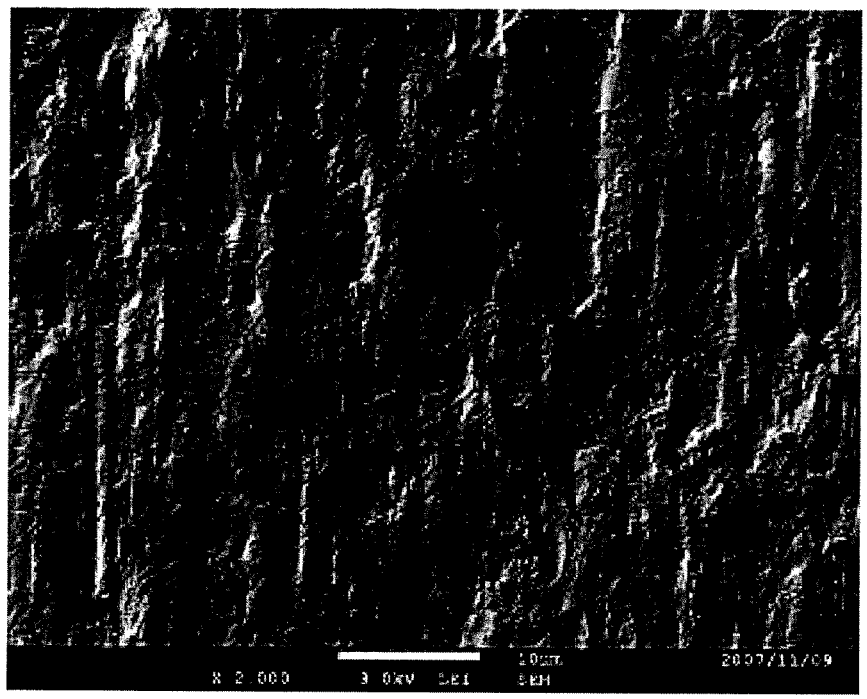
Figure 13:
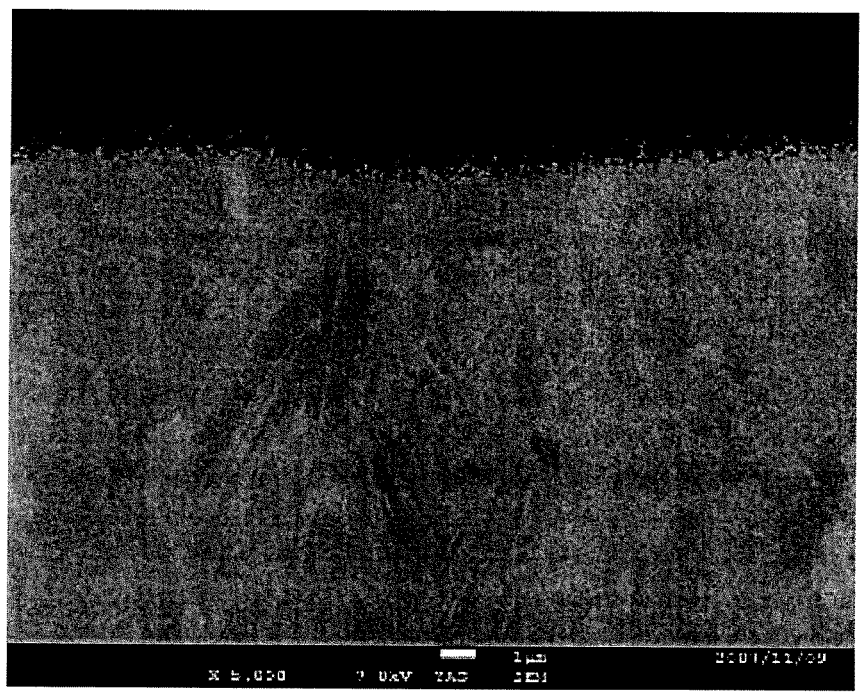
FIGS. 13-15 are images observing the cross-sectional conditions of a copper-clad laminate using a scanning electron microscope (pictured at a magnification power of 5,000), where
Figure 14:
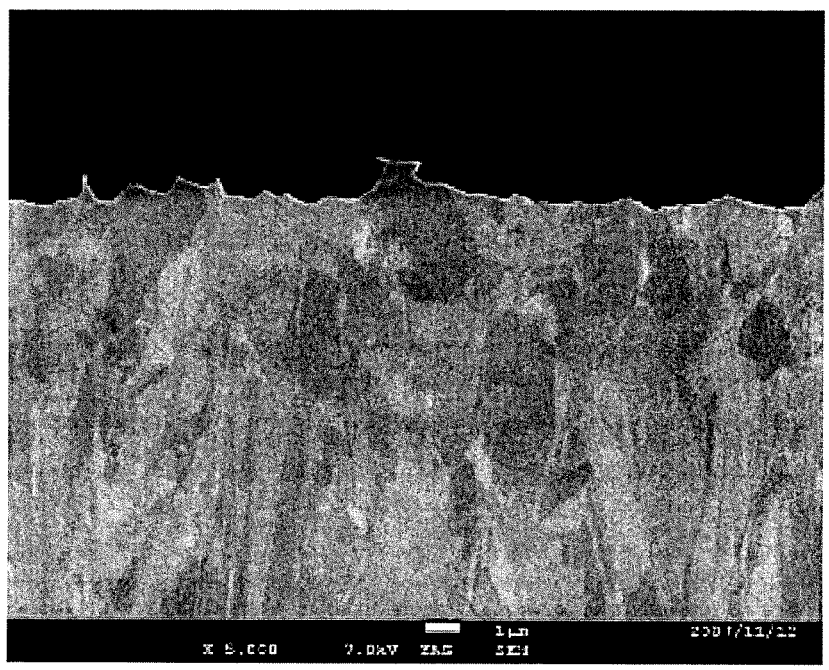
Figure 15:
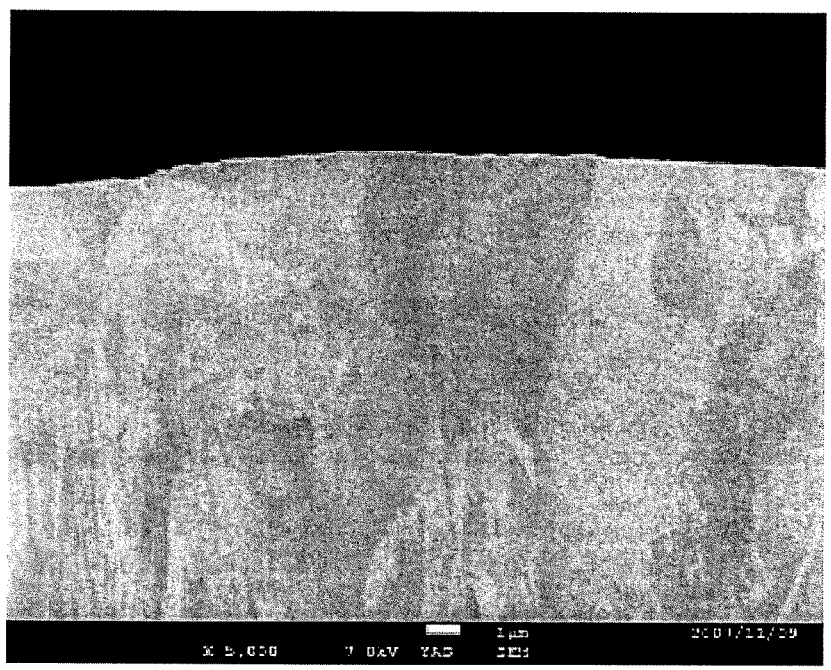

A copper-clad laminate whose surface is treated according to the surface roughening treatment in the embodiments of the present invention (hereinafter referred to as "Example") and a copper-clad laminate which is not treated as such (hereinafter referred to as "Comparative Example") were compared with regard to their surface configurations, cross-sectional configurations and characteristics in absorbing electromagnetic waves. As for the examples, three varieties were used: a copper-clad laminate processed by a black oxide treatment (hereinafter referred to as "Example (1)"), a copper-clad laminate processed by a chemical etching treatment (hereinafter referred to as "Example (2)") and a copper-clad laminate with a gold-plated surface (hereinafter referred to as "Example 3"). As for Example (3), only the characteristics in absorbing electromagnetic waves were compared. FIG. 10 shows the surface configuration of Example (1) observed using FE-SEM (equipment: JEOL, accelerated voltage: 3 kV) (picture magnification 2,000-power); FIG. 11 shows that of Example (2) and FIG. 12 shows that of Comparative Example. FIG. 13 shows the cross-sectional configuration of Example (1) observed using FE-SEM (equipment: JSM-7500F, accelerated voltage: 7 kV) (picture magnification 5,000-power); FIG. 14 shows that of Example (2) and FIG. 15 shows that of Comparative Example. When photographing the cross-sectional configuration, each testing unit is embedded in epoxy resin and polished.

FIG. 16 shows calculation results of surface roughness parameters. Cross-sectional images in FIGS. 13, 14, 15 were binarized to sample surface profiles. Then, after processing tilting corrections to surface profiles, surface roughness parameters (Ra) (arithmetic mean deviation of the profile), RMS (root mean square roughness), surface lengths and the "Q" value were calculated. "Effect 1" indicates Example (1), "effect 2" indicates Example (2), "compare" indicates Comparative Example and "Surface length" indicates the length on the surface. The "Q" value is expressed by resonance frequency and band width, Q=resonance frequency/band width. The band width is a band width of a predetermined reception strength, for example, one half or more of a reception strength at a resonance frequency $\omega 0$. Thus, for a resonance frequency $\omega 0$, assuming that the resonance frequency $\omega 0$ exist between frequencies $\omega 1$ and $\omega 2$ ($>\omega 1$) having one half of the reception strength of the resonance frequency $\omega 0$, the expression becomes $Q=\omega 0/(\omega 2-\omega 1)$.

As a result of observing the surface configurations and cross-sectional configurations, it was found that, as shown in FIGS. 10 and 13, on the surface of Example 1 a roughened surface covered by particles with a size in the range of 10-20 nm and configured resembling a cluster of trees with a roughness in the range of 0.1-1.0 µm was formed and that the length of the surface is substantially greater than in Comparative Example. Specifically, it was confirmed that where the subject distance had 24 µm for the length of a straight line, the length of the surface was measured 92 µm, making the length of the surface more than three times longer than the length of the straight line. The length of the surface means a total length of a line measured along a contour of the roughened surface in the subject distance. Also, as shown in FIGS. 11 and 14, it was found that on the surface of Example (2), a surface with 0.1-5.0 µm-roughness having acute angles was formed, and that, as found in FIG. 16, the RMS (root mean square roughness) value was greater than in Comparative Example To measure absorption characteristics of electromagnetic waves, a high-frequency loop antenna, which was connected to a vector network analyzer, a cylindrical hollow resonance device (device name: Wiltron 37225, measuring frequencies: vicinity of 1 GHz), was placed in a cylindrical casing and coupled with a magnetic field. Then, each testing unit was arranged in the casing while the frequency sweep was maintained and the "Q" value in the casing was measured before and after the testing unit was arranged to make comparison. As for testing units, those in a square, 25 mm on each side, were used.

When a testing unit is placed, the "Q" value lowers and the resonance amplitude is reduced. In Examples (1, 2, 3), the difference in the "Q" values before and after the testing units were placed was greater than that in Comparative Example, indicating that reduction in the resonance amplitude was large. Especially in Example (2), absorption characteristics of electromagnetic waves were observed.

A multilayer printed wiring board according to an embodiment of the present invention has: a multilayer wiring substrate in which conductive circuits and insulation layers are formed and the conductive circuits separated by insulation layers are electrically connected with each other through vias; a concave portion formed in the insulation layer; electromagnetic shielding layers formed on the bottom surface and at least on either side surface of the concave portion and having a roughened surface; and an electronic component accommodated in the concave portion.

Preferably, the electromagnetic shielding layer on the bottom surface of the concave portion is structured with a conductive layer formed on the surface of the insulation layer in the multilayer printed wiring substrate. Preferably, the electromagnetic shielding layer is made of metal. Preferably, the electromagnetic shielding layers on the bottom surface as well as either on both side surfaces or one side surface of the concave portion are made of material having greater absorption loss than the wiring material to form the conductive circuits; and the other electromagnetic shielding layer positioned opposite so as to sandwich any insulation layer on the bottom side of the concave portion is made of material having reflection loss the same as, or greater than, the wiring material to form the conductive circuits. Preferably, the electromagnetic shielding layer formed on the bottom surface of the concave portion and having a roughened surface is made of material having less reflection loss of electromagnetic waves than the other electromagnetic shielding layer positioned opposite so as to sandwich any insulation layer on the bottom side of the concave portion.

Also, the electromagnetic shielding layer formed on the bottom surface of the concave portion and having a roughened surface may be made of material having greater absorption loss of electromagnetic waves than the other electromagnetic shielding layer positioned opposite so as to sandwich any insulation layer on the bottom side of the concave portion.

Preferably, the electromagnetic shielding layer formed at least on a side surface of the concave portion and having a roughened surface is made of material having less reflection loss than the other opposite electromagnetic shielding layer positioned to a side of the concave portion in the same insulation layer.

Also, the electromagnetic shielding layer formed at least on a side surface of the concave portion and having a roughened surface may be made of material having greater absorption loss than the other opposite electromagnetic shielding layer positioned to a side of the concave portion in the same insulation layer.

A multilayer printed wiring board according to another embodiment of the present invention has: a multilayer wiring substrate in which conductive circuits and insulation layers are formed and the conductive circuits separated by insulation layers are electrically connected with each other through vias; a concave portion formed in the insulation layer; electromagnetic shielding layers structured with two or more layers and formed on the bottom surface as well as at least on one side surface of the concave portion; and an electronic component accommodated in the concave portion.

Preferably, at least one layer of the electromagnetic shielding layers structured with two or more layers is made of metal. Preferably, the electromagnetic shielding layer formed on the bottom surface of the concave portion is made of material having less reflection loss of electromagnetic waves than the other electromagnetic shielding layer positioned opposite so as to sandwich any insulation layer on the bottom side of the concave portion.

Also, the electromagnetic shielding layer formed on the bottom surface of the concave portion may be made of material having greater absorption loss of electromagnetic waves than the other electromagnetic shielding layer positioned opposite so as to sandwich any insulation layer on the bottom side of the concave portion.

Preferably, either layer of the electromagnetic shielding layers formed at least on one side surface of the concave portion is made of material having less reflection loss of electromagnetic waves than the other opposite electromagnetic shielding layer positioned to a side of the concave portion in the same insulation layer.

Also, either layer of the electromagnetic shielding layers formed at least on one side surface of the concave portion may be made of material having greater absorption loss of electromagnetic waves than the other opposite electromagnetic shielding layer positioned to a side of the concave portion in the same insulation layer.

Preferably, an electromagnetic shielding layer that appears as the surface layer of the electromagnetic shielding layers structured with two or more layers on the bottom surface and at least on a side surface of the concave portion is made of material having less reflection loss of electromagnetic waves than any electromagnetic shielding layer other than the surface layer among the two or more layers.

Also, an electromagnetic shielding layer that appears as the surface layer of the electromagnetic shielding layers structured with two or more layers on the bottom surface and at least on a side surface of the concave portion may be made of material having greater absorption loss of electromagnetic waves than any electromagnetic shielding layer other than the surface layer among the two or more layers.

More preferably, the surface of the electromagnetic shielding layer that appears as the surface layer on the bottom surface and at least on either side surface of the concave portion is roughened.

According to yet another embodiment of the present invention, a method of manufacturing a multilayer printed wiring board, which contains a multilayer wiring substrate having conductive circuits and insulation layers and the conductive circuits separated by insulation layers being electrically connected with each other through vias, has: a step to form a concave portion in an insulation layer of the multilayer wiring substrate; a shielding-layer-forming step to form electromagnetic shielding layers on the bottom surface and at least on one side surface of the concave portion; a roughening step to roughen the surface of the electromagnetic shielding layers formed on the bottom surface and at least on one side surface of the concave portion; and a step to embed an electronic component in the concave portion.

According to still another embodiment of the present invention, a method of manufacturing a multilayer printed wiring board, which contains a multilayer wiring substrate having conductive circuits and insulation layers and the conductive circuits separated by insulation layers being electrically connected to each other through vias, has: a step to form a concave portion in an insulation layer of the multilayer wiring substrate; a first-shielding layer forming step to form first electromagnetic shielding layers on the bottom surface and at least on one side of the concave portion; a step to form a second electromagnetic shielding layer, which is closer to the surface layer of the concave portion than at least part of the first electromagnetic shielding layers, with a material having either less reflection loss of magnetic waves or a greater absorption loss of electromagnetic waves than the first electromagnetic shielding layers; and a step to embed an electronic component in the concave portion.

Preferably, the method has a surface-roughening step on the second electromagnetic shielding layer.

In a multilayer wiring board according to an embodiment of the present invention, each concave portion is separated by electromagnetic shielding. Thus, electromagnetic interference between each other is prevented, and in one multilayer wiring board, digital signal circuits, analog signal circuits and memory circuits may be mixed. As a result, circuits with different characteristics may be integrated in one multilayer wiring board, leading to an even higher-density structure of electronic circuits. Accordingly, mobile terminals or the like may be formed compactly.

Obviously, numerous modifications and variations of the present invention are possible in light of the above teachings. It is therefore to be understood that within the scope of the appended claims, the invention may be practiced otherwise than as specifically described herein.

What is claimed is:

1. A multilayer wiring board comprising:
   a multilayer wiring substrate having a concave portion which accommodates an electronic component, the multilayer wiring substrate comprising a plurality of insulation layers, a plurality of conductive circuits, a plurality of vias and an electromagnetic shielding layer,
   wherein the conductive circuits are separated by the insulation layers and electrically connected through the vias, the electromagnetic shielding layer comprises a plurality of electromagnetic shielding sub-layers and formed along one of a bottom surface and side surfaces of the concave portion in the multilayer wiring substrate, the electromagnetic shielding sub-layers include a surface layer which comprises at least one of a first metal material and a second metal material, the first metal material has a reflection loss of electromagnetic waves which is less than a reflection loss of electromagnetic waves of other ones of the electromagnetic shielding sub-layers, the second metal material has an absorption loss of electromagnetic waves which is greater than an absorption loss of electromagnetic waves of other ones of the electromagnetic shielding sub-layers, and the surface of the electromagnetic shielding sub-layers includes the surface layer which is roughened.

2. The multilayer wiring board according to claim 1, wherein the electromagnetic shielding layer comprises a conductive layer formed on a surface of one of the insulation layers.

3. The multilayer wiring board according to claim 1, wherein the bottom surface of the concave portion is lined with the electromagnetic shielding layer, the multilayer wiring substrate has a second electromagnetic shielding layer separated from the concave portion by at least one of the insulation layers, the electromagnetic shielding layer comprises a material having an absorption loss of electromagnetic waves which is greater than an absorption loss of electromagnetic waves of a wiring material forming the conductive circuits, and the second electromagnetic shielding layer comprises a material having a reflection loss of electromagnetic waves which is equal to or greater than a reflection loss of electromagnetic waves of a wiring material forming the conductive circuits.

4. The multilayer wiring board according to claim 1, wherein the bottom surface of the concave portion is lined with the electromagnetic shielding layer, the multilayer wiring substrate has a second electromagnetic shielding layer separated from the concave portion by at least one of the insulation layers, the electromagnetic shielding layer comprises a material having a reflection loss of electromagnetic waves which is less than a reflection loss of electromagnetic waves of a material forming the second electromagnetic shielding layer.

5. The multilayer wiring board according to claim 1, wherein the bottom surface of the concave portion is lined with the electromagnetic shielding layer, the multilayer wiring substrate has a second electromagnetic shielding layer separated from the concave portion by at least one of the insulation layers, the electromagnetic shielding layer comprises a material having an absorption loss of electromagnetic waves which is greater than an absorption loss of electromagnetic waves of a material forming the second electromagnetic shielding layer.

6. The multilayer wiring board according to claim 1, wherein the concave portion has one of the side surfaces lined with the electromagnetic shielding layer, the multilayer wiring substrate has a second electromagnetic shielding layer formed adjacent to the concave portion in a same one of the insulation layers, the electromagnetic shielding layer comprises a material having a reflection loss of electromagnetic waves which is less than a reflection loss of electromagnetic waves of a material forming the second electromagnetic shielding layer.

7. The multilayer wiring board according to claim 1, wherein the concave portion has one of the side surfaces lined with the electromagnetic shielding layer, the multilayer wiring substrate has a second electromagnetic shielding layer formed adjacent to the concave portion in a same one of the insulation layers, the electromagnetic shielding layer comprises a material having an absorption loss of electromagnetic waves which is greater than an absorption loss of electromagnetic waves of a material forming the second electromagnetic shielding layer.

8. The multilayer wiring board according to claim 1, wherein the electromagnetic shielding sub-layers include the surface layer which comprises the first metal material having less a reflection loss of electromagnetic waves than a reflection loss of electromagnetic waves of other ones of the electromagnetic shielding sub-layers.

9. The multilayer wiring board according to claim 1, wherein the electromagnetic shielding sub-layers include the surface layer which comprises the second metal material having an absorption loss of electromagnetic waves which is greater than an absorption loss of electromagnetic waves of other ones of the electromagnetic shielding sub-layers.

* * * * *